US007829781B2

(12) United States Patent
Montello et al.

(10) Patent No.: US 7,829,781 B2
(45) Date of Patent: Nov. 9, 2010

(54) PHOTOVOLTAIC MODULE ARCHITECTURE

(75) Inventors: Alan Montello, West Newbury, MA (US); Kevin Oliver, Reading, MA (US); Kethinni G. Chittibabu, Westford, MA (US)

(73) Assignee: Konarka Technologies, Inc., Lowell, MA (US)

(*) Notice: Subject to any disclaimer, the term of this patent is extended or adjusted under 35 U.S.C. 154(b) by 527 days.

(21) Appl. No.: 11/134,872

(22) Filed: May 23, 2005

(65) Prior Publication Data

US 2005/0263178 A1 Dec. 1, 2005

Related U.S. Application Data

(60) Provisional application No. 60/575,971, filed on Jun. 1, 2004, provisional application No. 60/590,312, filed on Jul. 22, 2004, provisional application No. 60/590,313, filed on Jul. 22, 2004, provisional application No. 60/664,115, filed on Mar. 21, 2005.

(51) Int. Cl.

| | |
|---|---|
| ***H01L 25/00*** | (2006.01) |
| ***H01L 31/042*** | (2006.01) |
| ***H01L 31/00*** | (2006.01) |
| ***H02N 6/00*** | (2006.01) |

(52) U.S. Cl. ....................................... 136/244; 136/243

(58) Field of Classification Search ....................... None
See application file for complete search history.

(56) References Cited

U.S. PATENT DOCUMENTS

| | | | |
|---|---|---|---|
| 3,369,939 | A | 2/1968 | Myer |
| 3,575,721 | A | 4/1971 | Mann |
| 3,769,091 | A | 10/1973 | Leinkram et al. |
| 3,837,924 | A | 9/1974 | Baron |
| 4,089,576 | A | 5/1978 | Barchet |
| 4,174,978 | A | 11/1979 | Lidorenko et al. |
| 4,224,081 | A | 9/1980 | Kawamura et al. |
| 4,243,432 | A | 1/1981 | Jordan et al. |
| 4,334,120 | A | 6/1982 | Yamano et al. |
| 4,371,739 | A | 2/1983 | Lewis et al. |
| 4,499,658 | A | 2/1985 | Lewis |
| 4,571,494 | A | 2/1986 | Nishiki et al. |
| 4,574,160 | A | 3/1986 | Cull et al. |

(Continued)

FOREIGN PATENT DOCUMENTS

| | | |
|---|---|---|
| JP | 62 195 185 | 8/1987 |

(Continued)

OTHER PUBLICATIONS

Padinger et al., "Effects of Postproduction Treatment on Plastic Solar Cells," Advanced Functional Materials, 13(1):85-88, (2003).

(Continued)

*Primary Examiner*—Alexa D Neckel
*Assistant Examiner*—Shannon Gardner
(74) *Attorney, Agent, or Firm*—Fish & Richardson P.C.

(57) ABSTRACT

Modules are disclosed. The modules can include: a first photovoltaic cell including an electrode; a second photovoltaic cell including an electrode; and an interconnect that connects the electrodes of first and second photovoltaic cells. The interconnect can include: an electrically insulative material adhesive material; and a mesh partially disposed in the adhesive material.

35 Claims, 11 Drawing Sheets

U.S. PATENT DOCUMENTS

| | | | | |
|---|---|---|---|---|
| 4,609,770 | A | 9/1986 | Nishiura et al. | |
| 4,617,420 | A | 10/1986 | Dilts et al. | |
| 4,617,421 | A | 10/1986 | Nath et al. | |
| 4,652,693 | A | 3/1987 | Bar-On | |
| 4,670,293 | A | 6/1987 | Yamano et al. | |
| 4,677,248 | A | 6/1987 | Lacey | |
| 4,724,011 | A | 2/1988 | Turner et al. | |
| 4,746,618 | A | 5/1988 | Nath et al. | |
| 4,749,454 | A | 6/1988 | Arya et al. | |
| 4,754,544 | A | 7/1988 | Hanak | |
| 4,877,460 | A | 10/1989 | Flodl | |
| 4,879,251 | A | 11/1989 | Kruehler et al. | |
| 4,955,980 | A | 9/1990 | Masuo | |
| 5,100,808 | A * | 3/1992 | Glenn | 438/68 |
| 5,296,043 | A | 3/1994 | Kawakami et al. | |
| 5,330,583 | A | 7/1994 | Asai et al. | |
| 5,385,614 | A | 1/1995 | Albright et al. | |
| 5,437,735 | A | 8/1995 | Younan et al. | |
| 5,441,577 | A | 8/1995 | Sasaki et al. | |
| 5,510,174 | A | 4/1996 | Litman | |
| 5,571,338 | A | 11/1996 | Kadonome et al. | |
| 5,575,861 | A | 11/1996 | Younan et al. | |
| 5,593,901 | A | 1/1997 | Oswald et al. | |
| 5,660,646 | A | 8/1997 | Kataoka et al. | |
| 5,717,255 | A | 2/1998 | Haga et al. | |
| 5,830,779 | A | 11/1998 | Bressler et al. | |
| 6,039,896 | A | 3/2000 | Miyamoto et al. | |
| 6,069,313 | A | 5/2000 | Kay | |
| 6,239,352 | B1 | 5/2001 | Luch | |
| 6,291,763 | B1 | 9/2001 | Nakamura | |
| 6,313,396 | B1 * | 11/2001 | Glenn | 136/244 |
| 6,414,235 | B1 * | 7/2002 | Luch | 136/244 |
| 6,459,032 | B1 | 10/2002 | Luch | |
| 2001/0004901 | A1 * | 6/2001 | Yamanaka et al. | 136/263 |
| 2001/0054435 | A1 | 12/2001 | Nagao et al. | |
| 2003/0000569 | A1 | 1/2003 | Zwanenburg | |
| 2003/0047206 | A1 | 3/2003 | Kawam | |
| 2003/0201007 | A1 | 10/2003 | Fraas et al. | |
| 2003/0224155 | A1 | 12/2003 | Orth et al. | |
| 2004/0031219 | A1 | 2/2004 | Banister | |
| 2004/0035458 | A1 | 2/2004 | Beernink et al. | |
| 2005/0005964 | A1 * | 1/2005 | Komatsu | 136/263 |
| 2005/0103375 | A1 | 5/2005 | Nagao et al. | |
| 2008/0139053 | A1 | 6/2008 | Ries et al. | |

FOREIGN PATENT DOCUMENTS

| | | |
|---|---|---|
| JP | 02 244 772 | 9/1990 |
| JP | 06 029 564 | 2/1994 |
| JP | 11 186 577 | 7/1999 |

OTHER PUBLICATIONS

Definition of Tape from MSN Encarta® World English Dictionary, Accessed on Mar. 27, 2008.

* cited by examiner

PHOTOVOLTAIC MODULE ARCHITECTURE

CROSS-REFERENCE TO RELATED APPLICATIONS

This application claims priority under 35 U.S.C. §119(e) (1) to U.S. Provisional Patent Application Ser. No. 60/575,971, filed on Jun. 1, 2004, and entitled "Photovoltaic Cells with Conductive Interconnects"; U.S. Provisional Patent Application Ser. No. 60/590,312, filed on Jul. 22, 2004, and entitled "Photovoltaic Modules"; U.S. Provisional Patent Application No. 60/590,313, filed on Jul. 22, 2004, and entitled "Photovoltaic Cells with Conductive Mesh Interconnects"; and U.S. Provisional Patent Application Ser. No. 60/664,115, filed on Mar. 21, 2005, and entitled "Photovoltaic Module Architecture", all of which are hereby incorporated by reference.

TECHNICAL FIELD

This description relates to photovoltaic modules, as well as related systems, methods and components.

BACKGROUND

Photovoltaic cells, sometimes called solar cells, can convert light, such as sunlight, into electrical energy. A typical photovoltaic cell includes a layer of a photoactive material and a layer of a charge carrier material disposed between a cathode and an anode. When incident light excites the photoactive material, electrons are released. The released electrons are captured in the form of electrical energy within the electric circuit created between the cathode and the anode.

In one type of photovoltaic cell, commonly called a dye-sensitized solar cell (DSSC), the photoactive material typically includes a semiconductor material, such as titania, and a photosensitizing agent, such as, for example, a dye. In general, the dye is capable of absorbing photons within a wavelength range of operation (e.g., within the solar spectrum).

In another type of photovoltaic cell, commonly referred to as a polymer thin film cell, the photoactive material used generally has two components, an electron acceptor and an electron donor. The electron acceptor can be a p-type polymeric conductor material, such as, for example poly(phenylene vinylene) or poly(3-hexylthiophene). The electron donor can be a nanoparticulate material, such as for example, a derivative of fullerene (e.g., 1-(3-methoxy carbonyl)-propyl-1-1-phenyl-(6,6) $C_{61}$, known as PCBM).

Photovoltaic cells can be electrically connected together in series and/or in parallel to create a photovoltaic module. Typically, two photovoltaic cells are connected in parallel by electrically connecting the cathode of one cell with the cathode of the other cell, and the anode of one cell with the anode of the other cell. In general, two photovoltaic cells are connected in series by electrically connecting the anode of one cell with the cathode of the other cell.

SUMMARY

In one aspect, a module includes a first photovoltaic cell having an electrode and a second photovoltaic cell having an electrode. The module further includes an interconnect (e.g., an electrically conductive interconnect) that is disposed in the electrode of the first photovoltaic cell and the electrode of the second photovoltaic cell so that the electrode of the first photovoltaic cell and the electrode of the second photovoltaic cell are connected (e.g., electrically and/or mechanically connected).

In another aspect, a module includes a first photovoltaic cell having an electrode and a second photovoltaic cell having an electrode. The module further includes an interconnect (e.g., an electrically conductive interconnect) that connects (e.g., electrically connects and/or mechanically connects) the electrode of the first photovoltaic cell and the electrode of the second photovoltaic cell. The photovoltaic cells are configured so that a portion of the electrode of the first photovoltaic cell overlaps a portion of the electrode of the second photovoltaic cell.

In a further aspect, a module includes first and second photovoltaic cells. The first photovoltaic cell includes a cathode, an anode and a photoactive material between the cathode and the anode. The second photovoltaic cell includes a cathode, an anode and a photoactive material between the cathode and the anode. The module further includes an interconnect (e.g., an electrically conductive interconnect) that is disposed in the cathode of the first photovoltaic cell and the anode of the second photovoltaic cell so that the cathode of the first photovoltaic cell and the anode of the second photovoltaic cell are connected (e.g., electrically and/or mechanically connected).

In an additional aspect, a module includes first and second photovoltaic cells. The first photovoltaic cell includes a cathode, an anode and a photoactive material between the cathode and the anode. The second photovoltaic cell includes a cathode, an anode and a photoactive material between the cathode and the anode. The module further includes an interconnect (e.g., an electrically conductive interconnect) that is disposed in the cathode of the first photovoltaic cell and the cathode of the second photovoltaic cell so that the cathode of the first photovoltaic cell and the cathode of the second photovoltaic cell are connected (e.g., electrically and/or mechanically connected).

In another aspect, a module includes first and second photovoltaic cells. The first photovoltaic cell includes a cathode, an anode and a photoactive material between the cathode and the anode. The second photovoltaic cell includes a cathode, an anode and a photoactive material between the cathode and the anode. The module further includes an interconnect (e.g., an electrically conductive interconnect) that is disposed in the anode of the first photovoltaic cell and the anode of the second photovoltaic cell so that the anode of the first photovoltaic cell and the anode of the second photovoltaic cell are connected (e.g., electrically and/or mechanically connected).

In a further aspect, a module includes first and second photovoltaic cells. The first photovoltaic cell includes a cathode, an anode and a photoactive material between the cathode and the anode. The second photovoltaic cell includes a cathode, an anode and a photoactive material between the cathode and the anode. A portion of the anode of the second photovoltaic cell overlaps a portion of the cathode of the first photovoltaic cell. The module also includes an interconnect (e.g., an electrically conductive interconnect) that connects (e.g., electrically connects and/or mechanically connects) the cathode of the first photovoltaic cell and the anode of the second photovoltaic cell.

In an additional aspect, a module includes first and second photovoltaic cells. The first photovoltaic cell includes a cathode, an anode and a photoactive material between the cathode and the anode. The second photovoltaic cell includes a cathode, an anode and a photoactive material between the cathode and the anode. A portion of the anode of the second photovoltaic cell overlaps a portion of the cathode of the first photovoltaic cell. The module also includes an interconnect (e.g., an electrically conductive interconnect) that connects (e.g., electrically connects and/or mechanically connects) the cathode of the first photovoltaic cell and the cathode of the second photovoltaic cell.

In another aspect, a module includes first and second photovoltaic cells. The first photovoltaic cell includes a cathode, an anode and a photoactive material between the cathode and the anode. The second photovoltaic cell includes a cathode, an anode and a photoactive material between the cathode and the anode. A portion of the anode of the second photovoltaic cell overlaps a portion of the cathode of the first photovoltaic cell. The module also includes an interconnect (e.g., an electrically conductive interconnect) that connects (e.g., electrically connects and/or mechanically connects) the anode of the first photovoltaic cell and the anode of the second photovoltaic cell.

In a further aspect, a module includes first and photovoltaic cells, where the first and second photovoltaic cells are configured in a step-wise configuration.

In an additional aspect, a method of electrically connecting photovoltaic cells includes disposing an interconnect (e.g., an electrically conductive interconnect) in an electrode of a first photovoltaic cell and in an electrode of a second photovoltaic cell to connect (e.g., electrically connect and/or mechanically connect) the electrode of the first photovoltaic cell and the electrode of the second photovoltaic cell.

In one aspect, a module includes first and second photovoltaic cells. The module also includes an interconnect (e.g., an electrically conductive interconnect) that connects (e.g., electrically connects and/or mechanically connects) an electrode of the first photovoltaic cell and an electrode of the second photovoltaic cell. The interconnect includes an adhesive material and a mesh partially disposed in the adhesive material.

In another aspect, a module includes first and second photovoltaic cells. The first and second photovoltaic cells each include a cathode, an anode and a photoactive material between the cathode and the anode. The module also includes an interconnect (e.g., an electrically conductive interconnect) that electrically connects (e.g., electrically connects and/or mechanically connects) an electrode of the first photovoltaic cell and an electrode of the second photovoltaic cell. The electrically connected electrodes can be cathode/anode, cathode/cathode or anode/anode. The interconnect includes an adhesive material and a mesh partially disposed in the adhesive material.

In one aspect, a module includes a first photovoltaic cell including an electrode, and a second photovoltaic cell including an electrode having a bent end connected (e.g., electrically connected) to the electrode of the first photovoltaic cell.

In another aspect, a module includes a first photovoltaic cell including an electrode, and a second photovoltaic cell including an electrode. The electrode in the second photovoltaic cell has a shaped (e.g., dimpled) or bent portion that is connected (e.g., electrically connected) to the electrode of the first photovoltaic cell.

In one aspect, a module includes a first photovoltaic cell including an electrode, a second photovoltaic cell including an electrode, and an electrically conductive interconnect. The electrode of the first photovoltaic cell overlaps the electrode of the second photovoltaic cell. The interconnect electrically connects the electrode of the first photovoltaic cell and the electrode of the second photovoltaic cell. The interconnect mechanically couples the first and second photovoltaic cells.

In another aspect, a module includes a first photovoltaic cell including an electrode, a second photovoltaic cell including an electrode, the second photovoltaic cell overlapping the first photovoltaic cell to define an overlapping region, and an interconnect adjacent the overlapping region to electrically and mechanically connect the first and second photovoltaic cells.

In a further aspect, a photovoltaic module includes a first photovoltaic cell including an electrode with a first surface, a second photovoltaic cell including an electrode with a second surface, and an interconnect (e.g., an electrically conductive interconnect) that connects (e.g., electrically connects and/or mechanically connects) the first and second photovoltaic cells. The interconnect is supported by the first and second surfaces.

In an additional aspect, a module includes first and second photovoltaic cells. The efficiency of the module is at least about 80% of the efficiency of one of the photovoltaic cells.

In an additional aspect, a method includes making one or more of the preceding modules via a continuous process.

In another aspect, a method includes making one or more of the preceding modules via a roll-to-roll process.

Embodiments can provide one or more of the following advantages.

In some embodiments, the interconnects can connect (e.g., serially connect) two or more photovoltaic cells with little ohmic loss. This can be particularly desirable when trying to maximize voltage, amperage and/or power output from photovoltaic cells and modules.

In certain embodiments, the interconnects can connect (e.g., serially connect) two or more photovoltaic cells together with little or no increase in fill-factor and little or no decrease in efficiency as compared to a single photovoltaic cell.

In some embodiments, the interconnects can mechanically connect adjacent photovoltaic cells together, thereby reducing (e.g., eliminating) the use seals (e.g., seals including) adhesives within photovoltaic modules. This can enhance the useful lifetime of a module by, for example, reducing the amount and/or presence of one or more materials that can be reactive with one or more of the components contained in a photovoltaic cell, and/or by, for example, reducing (e.g., eliminating) leak paths present in a module.

In certain embodiments, the interconnects can provide a robust mechanical and/or highly electrically conductive connection between the cathode of the first photovoltaic cell and the anode of the second photovoltaic cell.

In embodiments that include an interconnect in the shape of a mesh, the mesh in the interconnect can form multiple points of electrical contact with each electrode. Having multiple points of contact between the electrodes can increase the electrical conductivity between electrodes by providing a larger area and volume for electrical current to pass between electrodes via the interconnect. Alternatively or additionally, having multiple points of contact between the electrodes can enhance the stability of the flow of electrons between electrodes via the interconnect. For example, under certain circumstances, a module may be flexed or bent, which can temporarily or permanently break a point of contact between the interconnect and one of the electrodes. The resulting reduction in electrical conductivity between electrodes is reduced when multiple points of electrical contact are present.

In embodiments that include an interconnect in the shape of a mesh, the mesh can be formed of relatively fine strands without substantial difficulty.

In embodiments that include an interconnect in the shape of a mesh, the absolute height of the metal mesh can set the gap/space between the electrodes, and allow for this gap/space to be relatively small.

In embodiments that include an interconnect that includes an adhesive, the adhesive can enhance the mechanical integrity of the interconnect by, for example, providing multiple points of adhesive bonding between the electrodes in adjacent photovoltaic cells in the module. Alternatively or additionally, the adhesive can provide electrical insulation between certain components of the module that are not desired to be in electrical contact.

In some embodiments, the modules can provide good electrical contact between electrodes in adjacent photovoltaic cells without the presence of a separate interconnect to provide the electrical communication. This can reduce the cost and/or complexity associated with manufacture of the modules. For example, by forming the shaped (e.g., dimpled) portions of the cathode (and/or anode) during the process of manufacturing the module, the complexity of aligning various portions of the module can be reduced.

In certain embodiments, an oxide film can form on the surface of the cathode during processing (e.g., sintering of the titania). In such embodiments, the process of shaping the portions of the cathode can break the oxide film, which can enhance the electrical conductivity between the cathode and the anode.

In some embodiments, the potential surface area of the adhesive/substrate bond can be relatively high, which can enhance the bond strength and reliability of the photovoltaic cell.

In certain embodiments, a module can include fewer components, which can enhance reliability and/or reduce cost.

In some embodiments, one or more of the materials that form an interconnect are commercially available in compositions that are substantially inert to other components of the module (e.g., the electrolyte(s)).

In certain embodiments, a module can include flexible substrates of photovoltaic cells are electrically and mechanically connected to form a flexible module which is well suited for wide-ranging implementations.

In some embodiments, an interconnect can electrically and/or mechanically interconnect one or more photovoltaic cells (e.g., one or more adjacent photovoltaic cells) to formed a photovoltaic module having enhanced stability, enhanced reliability, reduced inactive area between photovoltaic cells (e.g., adjacent photovoltaic cells), and/or reduced inactive volume between photovoltaic cells (e.g., adjacent photovoltaic cells).

Features and advantages are set forth in the description, drawings and claims.

DESCRIPTION OF DRAWINGS

Like reference symbols in the various drawings indicate like elements.

DETAILED DESCRIPTION

In general, the description relates to photovoltaic modules formed by electrically and/or mechanically connecting one or more photovoltaic cells (e.g., one or more adjacent photovoltaic cells) using one or more interconnects. Embodiments of such modules are described below.

In some embodiments, the efficiency of a photovoltaic module can be at least about 80% (e.g., at least about 85%, at least about 90%, at least about 95%, at least about 98%) of the efficiency of one or more of the photovoltaic cells contained in the photovoltaic module.

As referred to herein, the efficiency of a photovoltaic cell is measured as follows. The photovoltaic cell is exposed to an A.M. 1.5 (100 mW per square cm) light source (Oriel Solar Simulator) for 30 seconds. The current generated within the photovoltaic cell is measured and plotted against voltage to determine the efficiency of the photovoltaic cell.

As used herein, the efficiency of a photovoltaic module is measured as follows. The photovoltaic module is exposed to an A.M. 1.5 (100 mW per square cm) light source (Oriel Solar Simulator) for 30 seconds. The current generated within the photovoltaic module is measured and plotted against voltage to determine the efficiency of the photovoltaic module.

Figure 1:
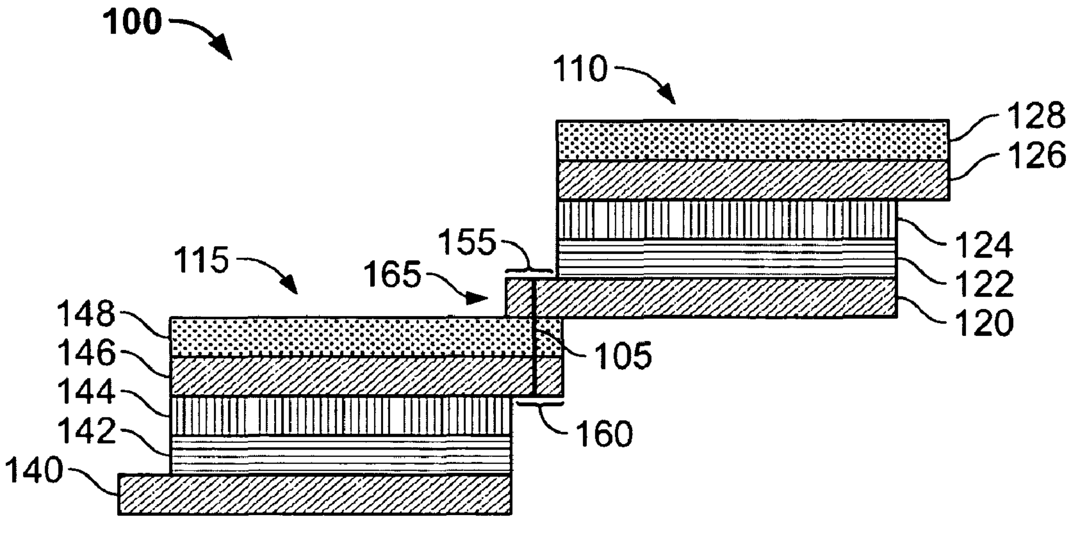
FIG. 1 is a cross-sectional view of an embodiment of a photovoltaic module including two photovoltaic cells.

FIG. 1 shows a cross-sectional view of a photovoltaic module 100 that includes an electrically conductive interconnect 105 that connects a first photovoltaic cell 110 to a second photovoltaic cell 115. The electrically conductive interconnect 105 can include a stitch, in one example. Photovoltaic cell 110 includes a cathode 120, a photoactive layer 122, a charge carrier layer 124, an anode 126, and a substrate 128. Similarly, photovoltaic cell 115 includes a cathode 140, a photoactive layer 142, a charge carrier layer 144, an anode 146, and a substrate 148. Photovoltaic cells 110 and 115 are positioned with respect to each other in a step-wise configuration, such that a portion 155 of photovoltaic cell 110 overlaps a portion 160 of photovoltaic cell 115, thereby forming an overlapping region 165. An electrically conductive interconnect 105 is disposed within overlapping region 165 to provide an electrically conductive path from cathode 120 to anode 146.

In general, electrically conductive interconnect 105 is sized to create an electrically conductive and continuous path from cathode 120 to anode 146. For example, in some embodiments, electrically conductive interconnect 105 is sized to extend through cathode 120, substrate 148 and anode 146 within overlapping region 165. In certain embodiments, electrically conductive interconnect 105 has a length of at least about 30 microns and/or at most about 500 microns (e.g., a length of from about 100 microns to about 200 microns).

Generally, the width of electrically conductive interconnect 105 can be selected as desired. In some embodiments, the width of electrically conductive interconnect 105 is selected so that the width of overlapping region 165 is relatively small. For example, in certain embodiments, the width of electrically conductive interconnect 105 is less than about 1500 microns (e.g., less than about 1000 microns, less than about 500 microns). Typically, electrically conductive interconnect 105 is at least about 100 microns wide. Reducing the width of the overlapping region 165 can be particularly desirable when trying to increase the available photoactive area within photovoltaic cells 110 and 115. For example, as the width of overlapping region 165 decreases, the area of the active region of module 100 increases.

In general, electrically conductive interconnect 105 can be made from any electrically conductive material. As referred to herein, an electrically conductive material has a conductivity of at least about 10 $(\Omega\text{-cm})^{-1}$ at 25° C. Typically, the material(s) used to form electrically conductive interconnect 105 is relatively strong so as to secure photovoltaic cell 110 to photovoltaic cell 115. Exemplary materials for forming electrically conductive interconnects 105 include, for example, metals, such as, copper and titanium, and alloys, such as, steel, tin-lead alloys, tin-bismuth alloys, lead-bismuth alloys, tin-bismuth-lead alloys. In certain embodiments, electrically conductive interconnect 105 can be formed of a material (e.g., a polymer fiber, such a nylon fiber, a polyester fiber, a Kevlar fiber, an Orlon fiber) that is coated with a metal or an alloy. In some embodiments, electrically conductive interconnect 105 is formed of a metal or an alloy coated with a low temperature solder, such as, for example, a tin-lead alloy, a tin-bismuth alloy, a lead-bismuth alloy, or a tin-bismuth-lead alloy. In certain embodiments, electrically conductive interconnect is formed of a metal or an alloy that is coated with an epoxy, such as, for example, a silver based epoxy.

Figure 2A:
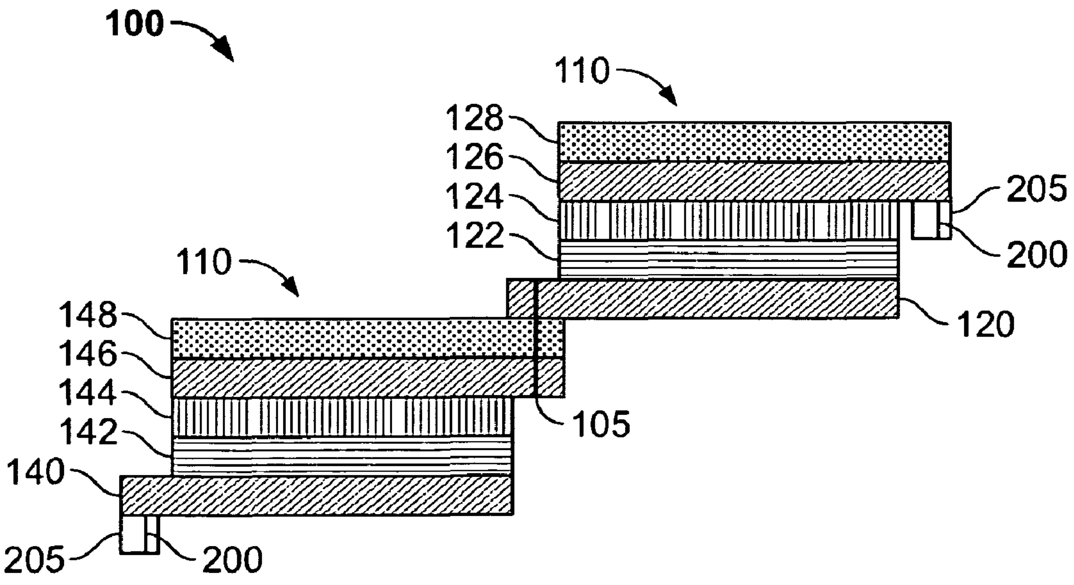
FIG. 2A is a cross-sectional view of another embodiment of a photovoltaic module.
Figure 2B:
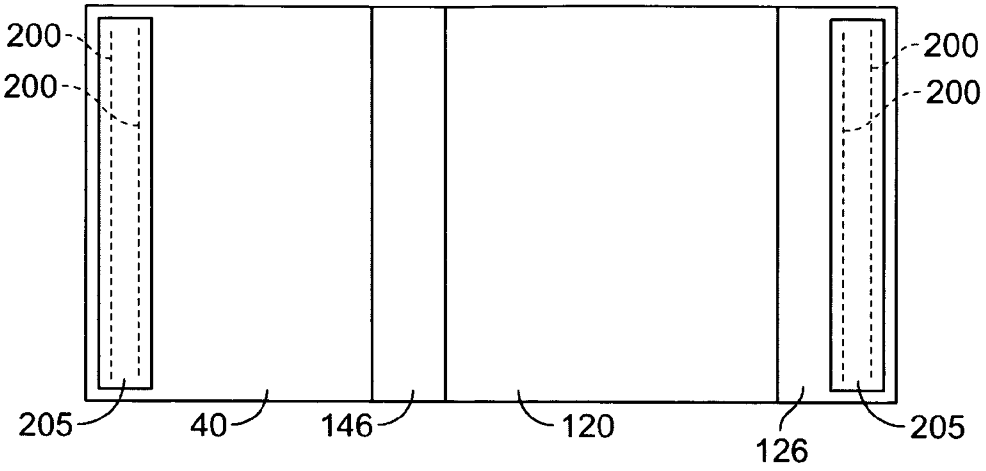
FIG. 2B is a bottom view of the photovoltaic module of FIG. 2A.

Referring to FIGS. 2A and 2B, interconnects 200, which may be electrically conductive or electrically insulating, (e.g., electrically conductive and/or electrically insulating stitches) can be used to secure terminal contacts 205 (e.g., metal tapes, thin metal foils, and metal braids) to the electrodes at the ends of photovoltaic module 100 (e.g., at anode 126 and at cathode 140). Terminal contacts 205 are typically used as a connection site between photovoltaic modules and electric devices, so that the electricity generated within the photovoltaic module can be used to drive connected electric devices.

In general, interconnects 200 can be made from any desired material. Typically, interconnects 200 are made from a material that is strong enough to secure the terminal contact to the desired electrode. Exemplary materials used for forming interconnects 200 include those noted above with respect to electrically conductive interconnect 105, and polymers.

Figure 3:
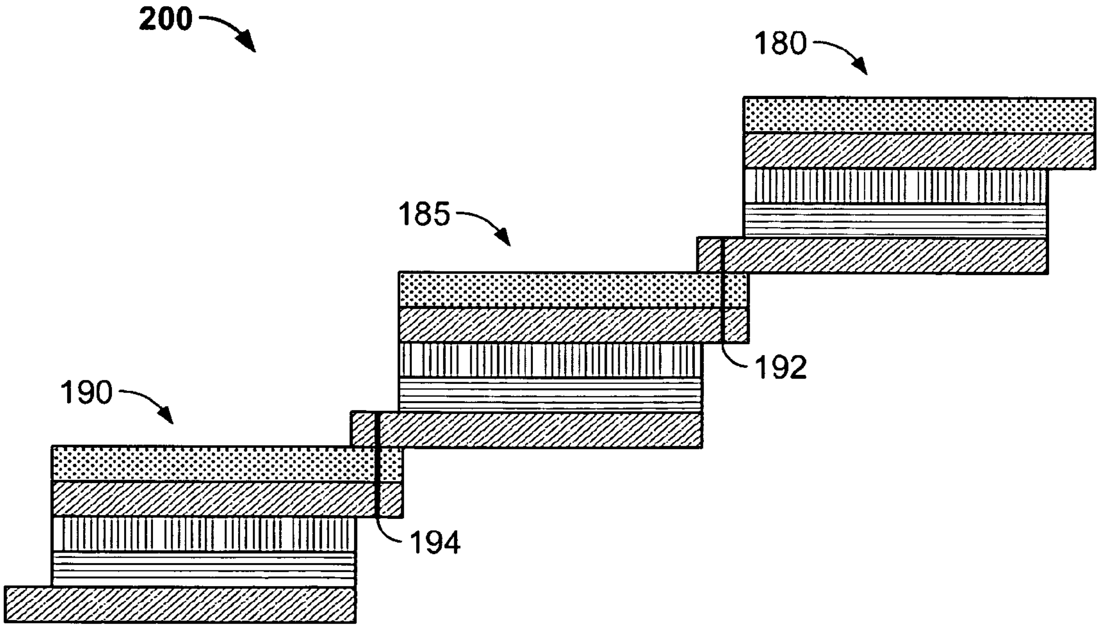
FIG. 3 is a cross-sectional view of an embodiment of a photovoltaic module including three photovoltaic cells.

While photovoltaic module 100 has been described as including two photovoltaic cells, a photovoltaic module can include more than two (e.g., three, four, five, six, seven) photovoltaic cells. For example, as shown in FIG. 3, a photovoltaic module 200 includes a first photovoltaic cell 180, a second photovoltaic cell 185 and a third photovoltaic cell 190. An electrically conductive interconnect 192 is used to join the cathode of photovoltaic cell 180 with the anode of photovoltaic cell 185, and a second electrically conductive interconnect 194 is used to join the cathode of photovoltaic cell 185 with the anode of photovoltaic cell 190.

Figure 4:
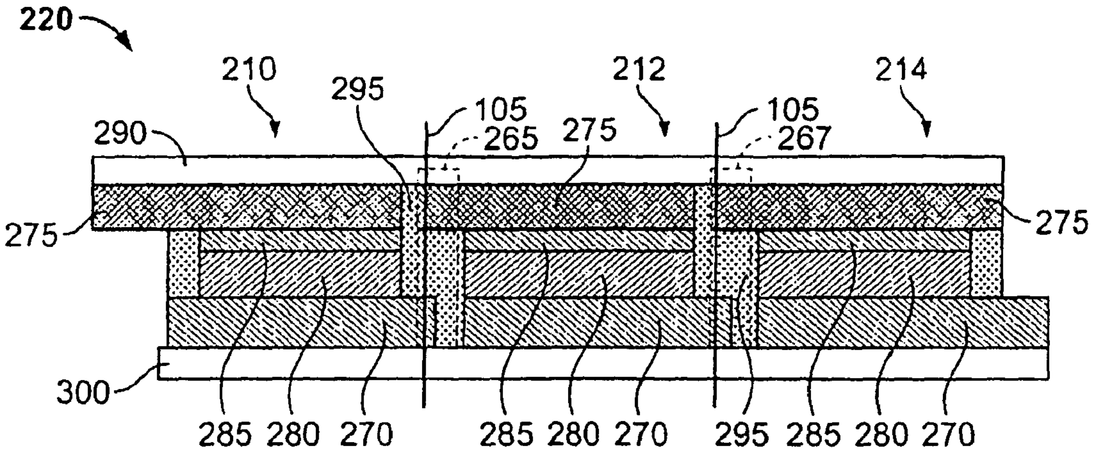
FIG. 4 is a cross-sectional view of another embodiment of a photovoltaic module including three photovoltaic cells.

While photovoltaic cells have been described as being positioned in a step-wise fashion with respect to each other to form an overlapping region in adjacent cells, in some embodiments, the photovoltaic cells in a photovoltaic module have a different arrangement. FIG. 4 shows a photovoltaic module 220 that includes photovoltaic cells 210, 212, and 214 that share a common substrate 290. Photovoltaic cells 210, 212, and 214 each include a photoactive layer 280 and a charge carrier layer 285 disposed between a cathode 270 and an anode 275. Regions 295 of electrically insulating material (e.g., formed of an adhesive) are positioned between cells 210 and 212 and between cells 212 and 214. A portion of cathode 270 of cell 210 overlaps a portion of anode 275 of cell 212 to form an overlapping region 265 within which electrically conductive interconnect 105 is positioned (in substrate 290, in anode 275 of cell 212, in region 295 between cells 210 and 212, in cathode 270 of cell 210, and in substrate 300). Likewise, a portion of cathode 270 of cell 212 overlaps a portion of anode 275 of cell 214 to form an overlapping region 267 within which electrically conductive interconnect 105 is positioned (in substrate 290, in anode 275 of cell 214, in region 295 between cells 212 and 214, in cathode 270 of cell 212, and in substrate 300).

Figure 5:
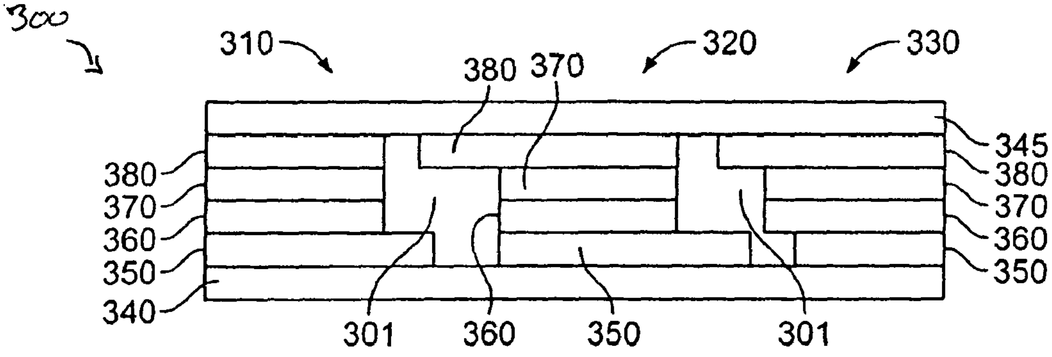
FIG. 5 is a cross-sectional view of an embodiment of a photovoltaic module.

FIG. 5 shows a module 300 that includes photovoltaic cells 310, 320 and 330 that share common substrates 340 and 345. Each photovoltaic cell includes cathode 350, a photoactive layer 360, a charge carrier layer 370 and an anode 380.

Figure 6:
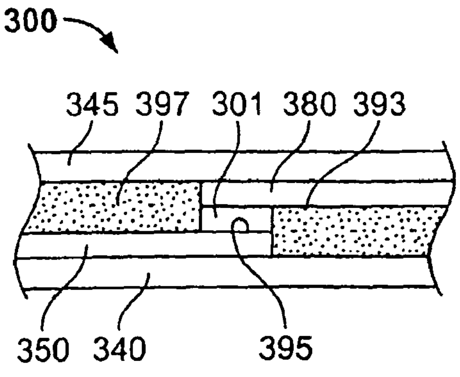
FIG. 6 is a cross-sectional view of a portion of the photovoltaic module of FIG. 5.
Figure 7:
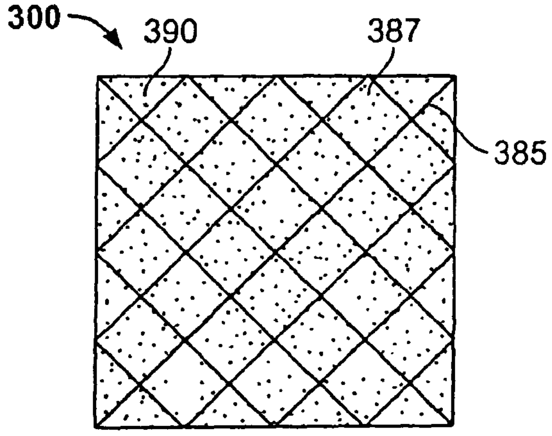
FIG. 7 is a cross-sectional view through a portion of the interconnect in the photovoltaic module in a direction perpendicular to the cross-section shown in FIGS. 5 and 6.

As shown in FIGS. 6 and 7, interconnect 301 is formed of a mesh and an electrically insulative material 390. The has electrically conductive regions 385 and open regions 387, and electrically insulative material 390 is disposed in open regions 387 of the mesh. An upper surface 393 of the mesh contacts anode 380, and a lower surface 395 of the mesh contacts cathode 350. With this arrangement, electrodes 350 and 380 in adjacent cells are electrically connected in the direction between electrodes 350 and 380 via regions 385 of the mesh, while adjacent photovoltaic cells are electrically insulated from each other by adhesive material 397 in the perpendicular plane.

The mesh can be prepared in various ways. In some embodiments, the mesh is an expanded mesh. An expanded metal mesh can be prepared, for example, by removing regions 387 (e.g., via laser removal, via chemical etching, via puncturing) from a sheet of material (e.g., an electrically conductive material, such as a metal or an alloy), followed by stretching the sheet (e.g., stretching the sheet in two dimensions). In certain embodiments, the mesh is a metal sheet formed by removing regions 387 (e.g., via laser removal, via chemical etching, via puncturing) without subsequently stretching the sheet. In some embodiments, the mesh is a woven mesh formed by weaving wires of material that form solid regions 385. The wires can be woven using, for example, a plain weave, a Dutch, weave, a twill weave, a Dutch twill weave, or combinations thereof. In certain embodiments, the mesh is formed of a welded wire mesh.

In general, solid regions 385 are formed entirely of an electrically conductive material (e.g., regions 385 are formed of a substantially homogeneous material that is electrically conductive). Examples of electrically conductive materials that can be used in regions 385 include electrically conductive metals, electrically conductive alloys and electrically conductive polymers. Exemplary electrically conductive metals include gold, silver, copper, nickel, palladium, platinum and titanium. Exemplary electrically conductive alloys include stainless steel (e.g., 332-stainless steel, 316-stainless steel), alloys of gold, alloys of silver, alloys of copper, alloys of nickel, alloys of palladium, alloys of platinum and alloys of titanium. Exemplary electrically conducting polymers include polythiophenes (e.g., poly(3,4-ethelynedioxythiophene) (PEDOT)), polyanilines (e.g., doped polyanilines), polypyrroles (e.g., doped polypyrroles). In some embodiments, combinations of electrically conductive materials are used.

In some embodiments, solid regions 385 are formed of a material that is coated with a different material (e.g., using metallization, using vapor deposition). In general, the inner material can be formed of any desired material (e.g., an electrically insulative material, an electrically conductive material, or a semiconductive material), and the outer material is an electrically conductive material. Examples of electrically insulative material from which the inner material can be formed include textiles, optical fiber materials, polymeric materials (e.g., a nylon) and natural materials (e.g., flax, cotton, wool, silk). Examples of electrically conductive materials from which the outer material can be formed include the electrically conductive materials disclosed above. Examples of semiconductive materials from which the outer material can be formed include indium tin oxide, fluorinated tin oxide, tin oxide and zinc oxide. In some embodiments, the inner material is in the form of a fiber, and the outer material is an electrically conductive material that is coated on the inner material. In certain embodiments, the inner material is in the form of a mesh (see discussion above) that, after being formed into a mesh, is coated with the outer material. As an example, the inner material can be an expanded metal mesh, and the outer material can be PEDOT that is coated on the expanded metal mesh.

Typically, the maximum thickness of the mesh in a direction substantially perpendicular to the surfaces of substrates 340 and 345 is at least 10 microns (e.g., at least about 15 microns, at least about 25 microns, at least about 50 microns) and/or at most about 250 microns (e.g., at most about 200 microns, at most about 150 microns, at most about 100 microns, at most about 75 microns).

While shown in FIG. 7 cross-sectional shape, open regions 387 can generally have any desired shape (e.g., square, circle, semicircle, triangle, ellipse, trapezoid, irregular shape). In some embodiments, different open regions 387 in the mesh can have different shapes.

Although shown in FIG. 7 as forming a diamond design, solid regions 385 can generally form any desired design (e.g., rectangle, circle, semicircle, triangle, ellipse, trapezoid, irregular shape). In some embodiments, different solid regions 385 in the mesh can have different shapes.

Figure 8A:
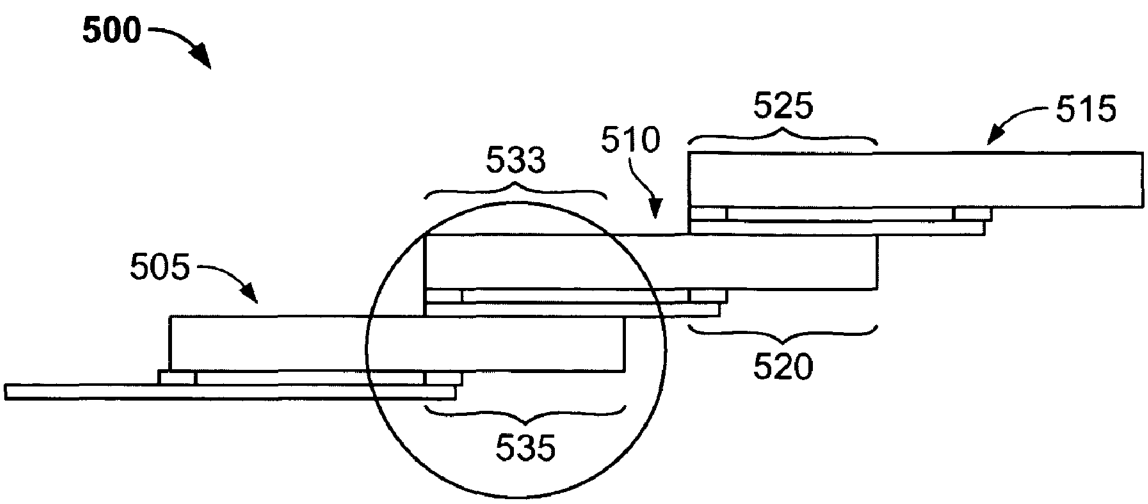
FIG. 8A is a side view of a photovoltaic module including three cells in a series configuration.
Figure 8B:
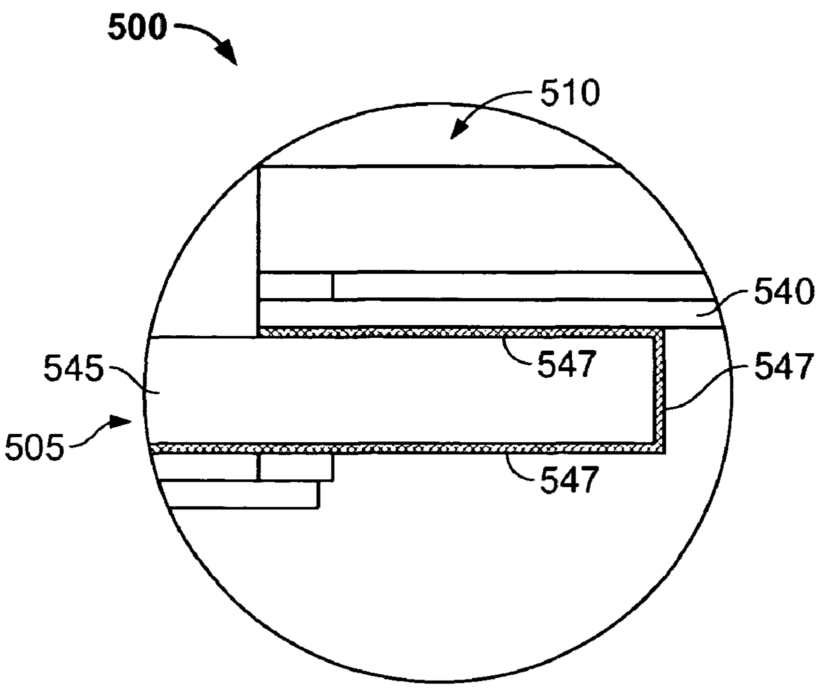
FIG. 8B is a detail view of the interconnect between adjacent cell in FIG. 8A.

FIGS. 8A and 8B show a photovoltaic module 500 that includes photovoltaic cells 505, 510 and 515 that are positioned in a step-wise configuration with respect to each other. A portion 525 of photovoltaic cell 515 overlaps a portion 520 of photovoltaic cell 510. Similarly, a portion 533 of photovoltaic cell 510 overlaps a portion 535 of photovoltaic cell 505. A cathode 540 of cell 505 is electrically connected to an anode 545 of adjacent cell 505 by wrapping the edge of the anode 545 with an electrically conductive tape 547. In some embodiments, the tape 547 can be sized to contact the entire back face of the cathode 540 and thus provide a mechanical attachment between adjacent cells or only a portion of the cathode 540. In embodiments in which the tape 547 does not cover all of the back face of the cathode 540, the exposed portion of the back face of the cathode 540 can be optionally coated with a non-conductive adhesive to supplement the attachment to the anode 545 to the adjacent cell 505.

While element 547 has been described as a conductive tape, more generally, element 547 can be any kind of electrically conductive element having the general structure described. In some embodiments, elements 547 is in the form of a coating.

Figure 9A:
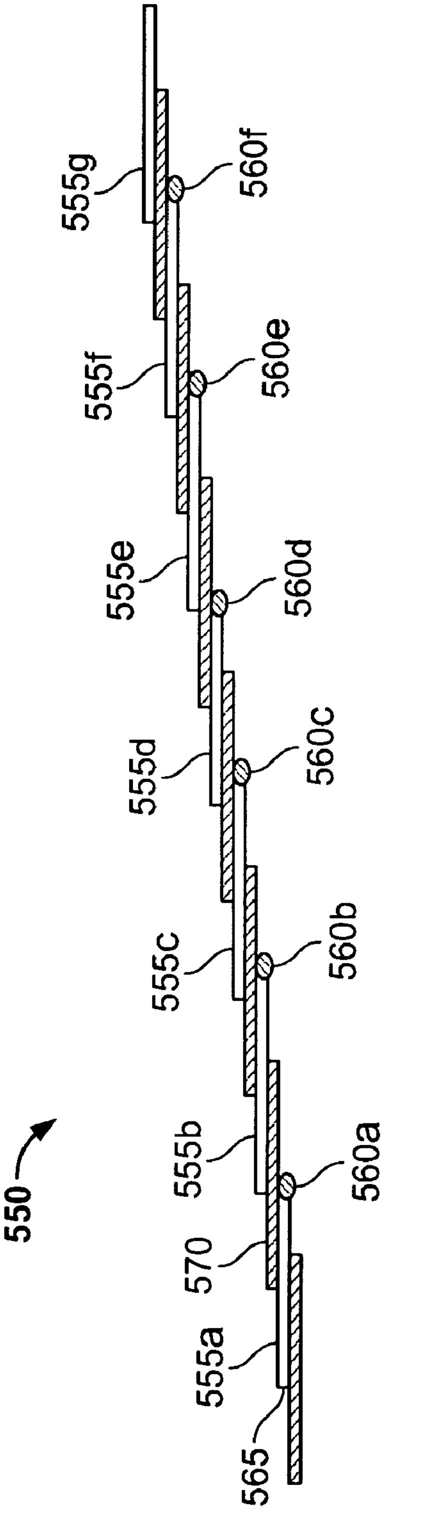
FIG. 9A is a side view of a photovoltaic module including seven cells in a series configuration including an interconnect paste positioned between the anode of one cell and the cathode of an adjacent cell.
Figure 9B:
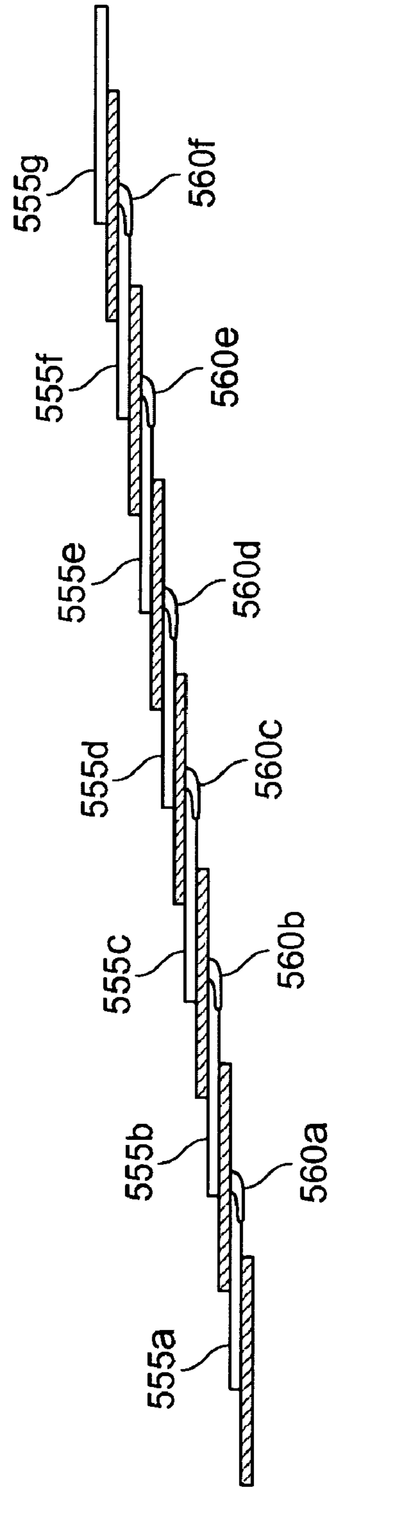
FIG. 9B is a side view of FIG. 9A with the paste pressed into place.

FIG. 9A shows a photovoltaic module 550 that includes seven overlapping cells 555*a*-555*g* arranged in step-wise configuration. Interconnect 560*a* is applied parallel to an edge of the cell 555*a* along the anode 565*a* for electrical and mechanical connection to the cathode 570 of adjacent cell 555*b*. Similarly, interconnects 560*b*-560*f* connect overlapping cells 555*b* and 555*c*, 555*c* and 555*d*, 555*d* and 555*e*, 555*e* and 555*f*, and 555*f* and 555*g*. FIG. 9B shows the interconnects 560 pressed into place to connect adjacent cells. In general, interconnects 560 can be formed of any appropriate electrically conductive material. In some embodiments, one or more interconnects 560 are formed of a bead of a conductive paste. Optionally, one or more of the interconnects 560 can be formed with a thermoplastic conductive ribbon, solder and/or fiber. Typically, in such embodiments, the material forming interconnect 560 is positioned parallel to the edge of one cell so that after applying the appropriate amount of heat and pressure, the interconnect is distributed over the cathode of one cell and the anode of an adjacent cell.

One or more of interconnects 560*a*-560*f* can be formed by a process that does not involve the use of heat or pressure (e.g., ink jet printing, painting/drying). Optionally, a thermal transfer process can be used to form one or more of interconnects 560*a*-560*f*.

In certain embodiments, one or more of interconnects 560*a*-560*f* can be formed of a mesh (e.g., an adhesive mesh), as described herein.

Figure 10:
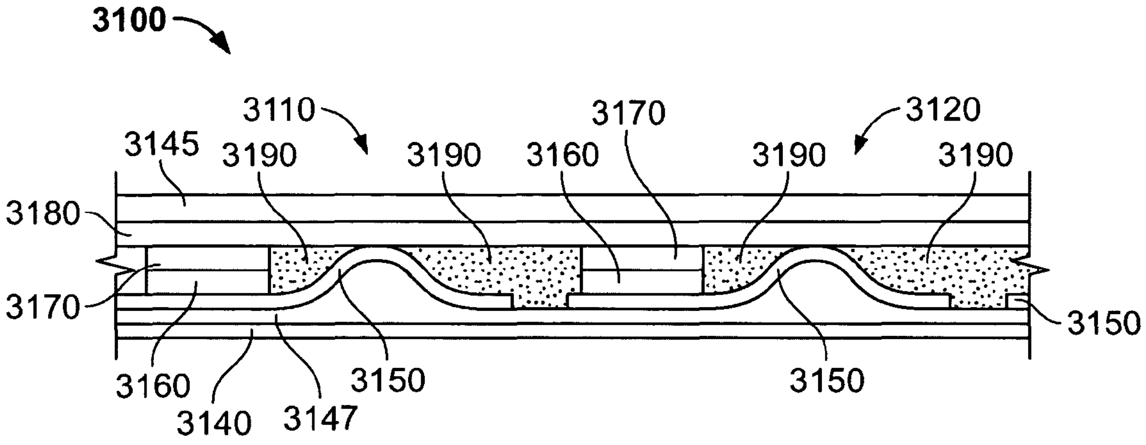
FIG. 10 is a cross-sectional view of an embodiment of a photovoltaic module.
Figure 11:
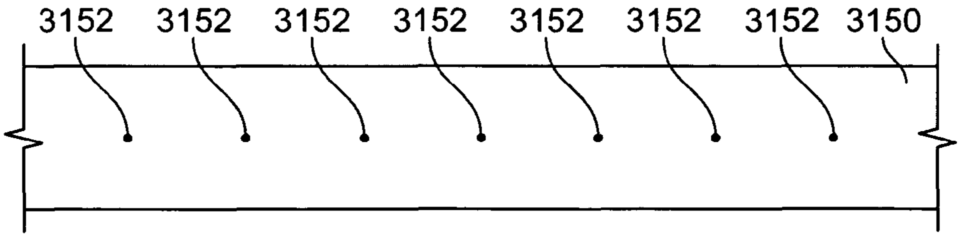
FIG. 11 is a perspective view of the cathode in the photovoltaic module in a direction perpendicular to the cross-section in FIG. 10.

FIG. 10 shows a photovoltaic module 3100 that includes photovoltaic cells 3110, 3120, and 3130 that share common substrates 3140 and 3145. Each photovoltaic cell includes an adhesive 3147, a cathode 3150, a photoactive layer 3160, a charge carrier layer 3170, a anode 3180 and an adhesive 3190. Cathode 3150 includes a shaped (e.g., dimpled, embossed) portion 3152 configured to extend through adhesive 3190 and make electrical contact with anode 3180. As shown in FIG. 11, cathode 3150 has multiple shaped portions 3152 with non-shaped portions therebetween. With this arrangement, shaped portions 3152 of cathode 3150 form an electrical connection between cathode 3150 and anode 3180 without using a separate interconnect component.

Although shown in FIG. 11 as being circular, more generally shaped portions 3152 can have any desired shape (e.g., square, circle, semicircle, triangle, ellipse, trapezoid, corrugated, such as sinusoidally corrugated, irregular shape).

Generally, cathodes 3150 are formed of a relatively thin, electrically conductive layer. In some embodiments, cathodes 3150 are formed of a metal or an alloy (e.g., titanium or indium) foil. In certain embodiments, cathodes are formed of a relatively thin layer of a plastic (see discussion regarding substrates 3140 and 3145 below) that has a surface coated with an electrically conductive material (e.g., a metal or an alloy, such as titanium or indium). Shaped portions 3152 can be formed using a variety of techniques, including standard foil embossing techniques. For example, in certain embodiments, shaped portions 3152 can be formed by running foil 3150 under a sewing machine with a blunted needle. As another example, in some embodiments, shaped portions 3152 can be formed by passing foil 3150 over a spinning wheel having protrusions (e.g., dimples). Shaped portions 3152 can be formed in foil 3150 before being incorporated into module 3100, or shaped portions 3152 can be formed in foil 3150 as module 3100 is being manufactured (see discussion below). In general electrode 3150 is substantially flat, except for embossments 3152. Although embossments 3152 can generally have any desired shape, embossments 3152 typically have a slight radius (e.g., so that forming embossments 3152 does not result in the formation of holes in electrode 3150).

Figure 12:
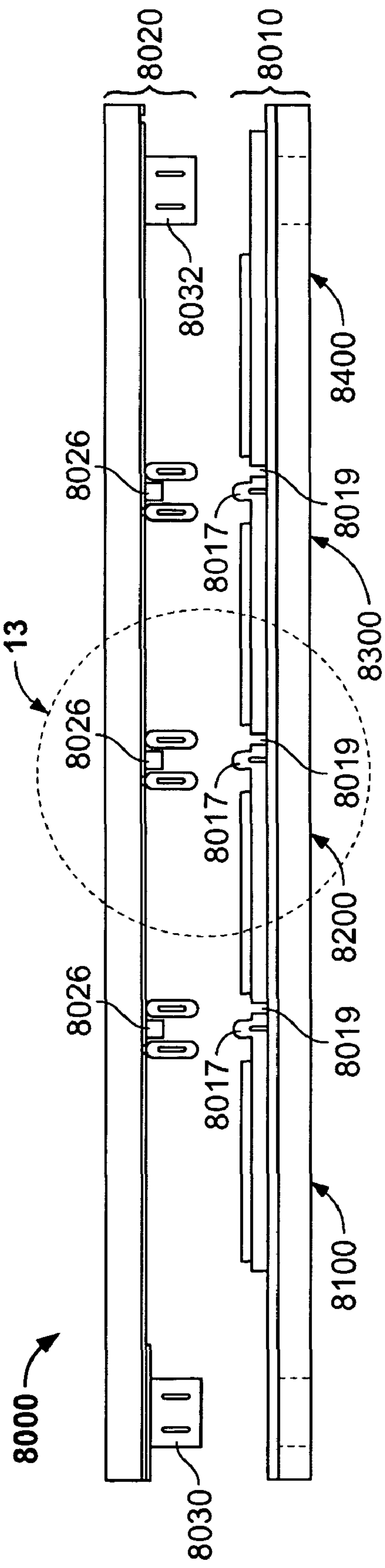
FIG. 12 is a cross-sectional view of an embodiment of a photovoltaic module.
Figure 13:
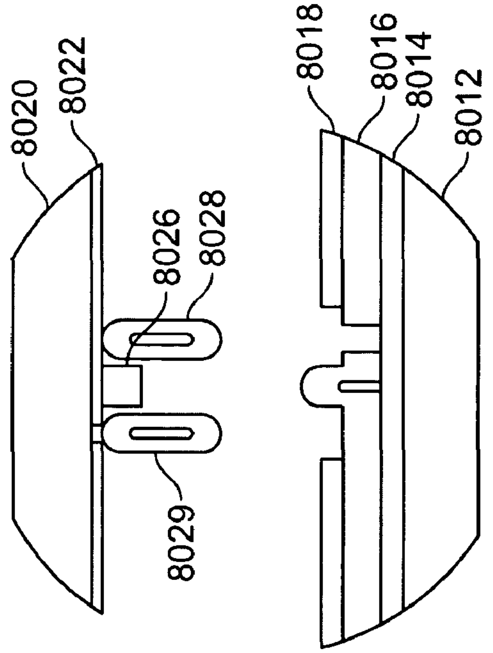
FIG. 13 is a cross-section view of a portion of the photovoltaic cell shown in FIG. 12.

FIGS. 12 and 13 show a partially exploded view of a photovoltaic module 8000 that includes photovoltaic cells 8100, 8200, 8300 and 8400. Each cell includes a cathode side 8010 and an anode side 8020. Each cathode side 8010 includes substrate 8012, an adhesive layer 8014 (e.g., a foil adhesive, such as a one mil thick foil adhesive), an electrically conductive layer 8016 (e.g., a metal layer, such as a two mils thick titanium foil) and a photoactive layer 8018 (e.g., a dye sensitized titania layer). Each anode side includes substrate 8020 and a catalyst layer 8022 (e.g., a platinum-containing catalyst layer). In cells 8100, 8200 and 8300, a region 8017 of each portion of layer 8016 is shaped (e.g., embossed, dimpled) and there is a gap 8019 between layers 8016 in adjacent photovoltaic cells.

Module 8000 further includes an electrically conductive bridge 8026 that, after assembly of module 8000, is in direct contact with corresponding portion 8017 of corresponding layer 8016, thereby providing an electrical connection. Bridges 8026 are typically compliant and electrically conductive. For example, bridges 8026 can be formed of a compliant polymer matrix containing electrically conductive particles (e.g., at sufficient loading to impart sufficient electrical conductivity to bridges 8026). In some embodiments, one or more bridges 8026 can contain titanium (e.g., in the form of a titanium composite). Although shown as separate components in the exploded views of FIGS. 12 and 13, in some embodiments, bridges 8026 can be disposed directly on corresponding portions 8017 of corresponding layers 8016. For example, a bridge 8026 can be printed onto a corresponding portion 8017 of corresponding layer 8016.

Module 8000 also includes seals 8028 and 8029. Seals 8028 and 8029 reduce leaking of components (e.g., between adjacent cells) and/or reduce corrosion of components (e.g., if moisture gets into one or more cells). When module 8000 is assembled, the upper and lower ends of seal 8029 contact layers 8014 and 8022, respectively, and the upper and lower ends of seal 8028 contacts layers 8026 and 8022, respectively. Seals 8028 and 8029 are generally formed of an adhesive material, such as those described herein, and may optionally containing one or more structural components (e.g., one more beads). In embodiments, in which seals 8028 and/or 8029 contain one or more structural components, the structural components are typically electrically nonconductive and/or at sufficiently low loading so that seals 8028 and/or 8029 are electrically nonconductive.

Module 8000 further includes end seals 8030 and 8032 (e.g., adhesive end seals).

Without wishing to be bound by theory, it is believed that modules having the general design illustrates in FIGS. 12 and 13 can allow for a relatively thin photovoltaic module, that still provides good electrical power and efficiency. It is believed that the use of multiple adhesive layers (e.g., seals 8028 and 8029) can provide an advantage in that construction of the module can be achieved without pushing a portion of a layer through an adhesive. This can also reduce the possibility of scratching one of the electrodes, which can result in a localized area of reduced electrical conductivity.

Figure 14:
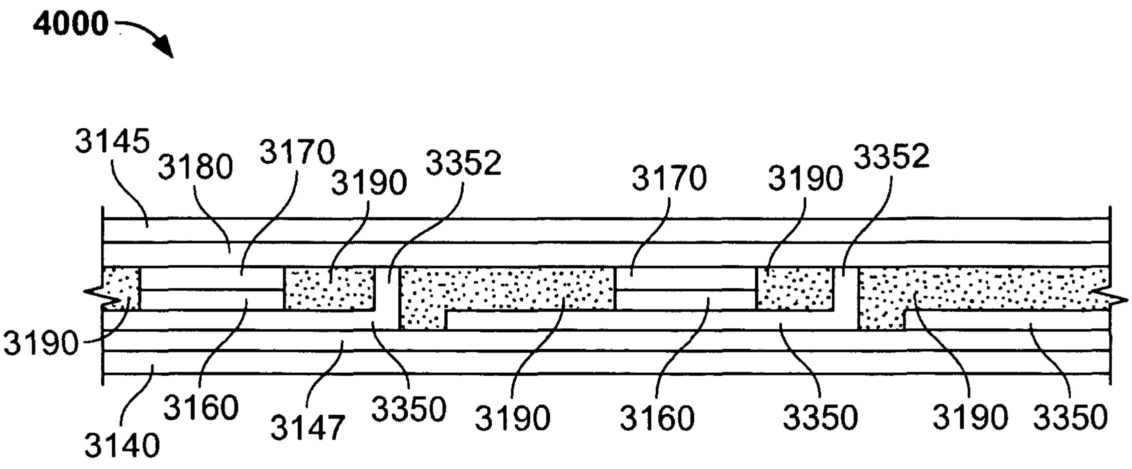
FIG. 14 is a cross-sectional view of another embodiment of a photovoltaic module.
Figure 15:
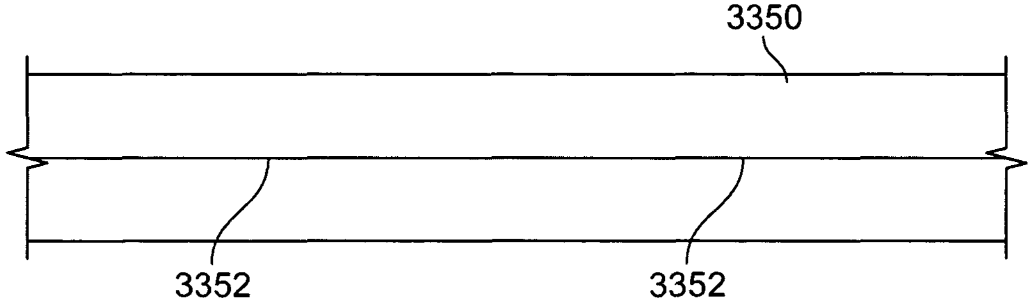
FIG. 15 is a perspective view of the cathode in the photovoltaic module in a direction perpendicular to the cross-section in FIG. 14.

FIG. 14 shows a photovoltaic module 4000 in which cathode 3350 has a bent end 3352 configured to extend through adhesive 3190 and make electrical contact with anode 3180. As shown in FIG. 15, bent end 3352 forms a cathode forms a line. With this arrangement, bent end 3352 of cathode 3350 form an electrical connection between cathode 3350 and anode 3180 without using a separate interconnect component.

Although shown in FIG. 15 as being continuous, in some embodiments, bent end 3352 can be noncontinuous (e.g., when viewed as shown in FIG. 15, there can be alternating portions of cathode 3350 having a bent end).

Further, although the cathodes have been described as being formed of a foil formed of certain materials, in some embodiments, one or more of the primary foils can be formed of a different material. In some embodiments, the cathodes can be formed of a foil of a transparent electrically conductive material, such as. Examples of such materials include certain metal oxides, such as indium tin oxide (ITO), tin oxide, a fluorine-doped tin oxide, and zinc-oxide.

In certain other embodiments, the cathodes can be a discontinuous layer of an electrically conductive material, such as an electrically conducting mesh. Suitable mesh materials include metals, such as palladium, titanium, platinum, stainless steel and alloys thereof. The mesh material can include a metal wire. The electrically conductive mesh material can also include an electrically insulating material that has been coated with an electrically conductive material, such as metal. The electrically insulating material can include a fiber, such as a textile fiber or an optical fiber. Examples of textile fibers include synthetic polymer fibers (e.g., nylons) and natural fibers (e.g., flax, cotton, wool, and silk). The mesh electrode can be flexible to facilitate, for example, formation of a photovoltaic cell by a continuous manufacturing process.

A mesh cathode can take a wide variety of forms with respect to, for example, wire (or fiber) diameters and mesh densities (i.e., the number of wire (or fiber) per unit area of the mesh). The mesh can be, for example, regular or irregular, with any number of opening shapes (e.g., square, circle, semicircle, triangular, diamond, ellipse, trapezoid, and/or irregular shapes). Mesh form factors (such as, e.g., wire diameter and mesh density) can be chosen, for example, based on the electrical conductivity of the wire (or fibers) of the mesh, the desired optical transmissivity, based on the electrical conductivity of the wires (or fibers) of the mesh, the desired optical transmissivity, flexibility, and/or mechanical strength. Typically, the mesh electrode includes a wire (or fiber) mesh with an average wire (or fiber) diameter in the range from about 1 micron to about 400 microns, and an average open area between wires (or fibers) in the range from about 60% to about 95%. A mesh electrode can be formed using a variety of techniques, such as, for example, ink jet printing, lithography and/or ablation (e.g., laser ablation). In some embodiments, a mesh electrode can be formed of an expanded metal mesh. Mesh electrodes are discussed in U.S. patent application Ser. No. 10/395,823, filed Mar. 23, 2003 and in U.S. patent application Ser. No. 10/723,554, filed Nov. 26, 2003.

Adhesives 3147 and 3190 can generally be formed of any electrically insulative adhesive. Examples of such adhesives include co-polymers of olefins, acrylates, and urethanes, and other hotmelt adhesives. Examples of commercially available adhesives include Bynel® adhesives (available from DuPont), thermobond adhesive 845 (available from 3M) and Dyneon™ THV220 fluoropolymer adhesive (available from 3M).

DSSCs

Figure 16:
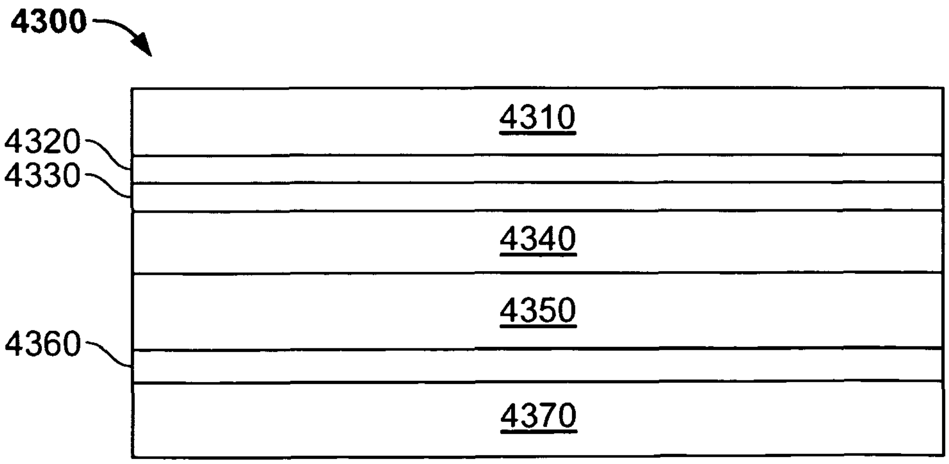
FIG. 16 is a cross-sectional view of an embodiment of a DSSC.

In some embodiments, a photovoltaic cell is a DSSC. FIG. 16 is a cross-sectional view of a DSSC 4300 including substrates 4310 and 4370, electrically conductive layers (electrodes) 4320 and 4360, a catalyst layer 4330, a charge carrier layer 4340, and a photoactive layer 4350.

Photoactive layer 4350 generally includes one or more dyes and a semiconductor material associated with the dye.

Examples of dyes include black dyes (e.g., tris(isothiocyanato)-ruthenium (II)-2,2':6',2"-terpyridine-4,4',4"-tricarboxylic acid, tris-tetrabutylammonium salt), orange dyes (e.g., tris(2,2'-bipyridyl-4,4'-dicarboxylato) ruthenium (II) dichloride, purple dyes (e.g., cis-bis(isothiocyanato)bis-(2,2'-bipyridyl-4,4'-dicarboxylato)-ruthenium (II)), red dyes (e.g., an eosin), green dyes (e.g., a merocyanine) and blue dyes (e.g., a cyanine). Examples of additional dyes include anthocyanines, porphyrins, phthalocyanines, squarates, and certain metal-containing dyes.

In some embodiments, photoactive layer 4350 can include multiple different dyes that form a pattern. Examples of patterns include camouflage patterns, roof tile patterns and shingle patterns. In some embodiments, the pattern can define the pattern of the housing a portable electronic device (e.g., a laptop computer, a cell phone). In certain embodiments, the pattern provided by the photovoltaic cell can define the pattern on the body of an automobile. Patterned photovoltaic cells are disclosed, for example, in co-pending and commonly owned U.S. Ser. No. 60/638,070, filed Dec. 21, 2004, which is hereby incorporated by reference.

Examples of semiconductor materials include materials having the formula $M_xO_y$, where M may be, for example, titanium, zirconium, tungsten, niobium, lanthanum, tantalum, terbium, or tin and x and y are integers greater than zero. Other suitable materials include sulfides, selenides, tellurides, and oxides of titanium, zirconium, tungsten, niobium, lanthanum, tantalum, terbium, tin, or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate may be suitable materials.

Typically, the semiconductor material contained within layer 4350 is in the form of nanoparticles. In some embodiments, the nanoparticles have an average size between about two nm and about 100 nm (e.g., between about 10 nm and 40 nm, such as about 20 nm). Examples of nanoparticle semiconductor materials are disclosed, for example, in co-pending and commonly owned U.S. Ser. No. 10/351,249, which is hereby incorporated by reference.

The nanoparticles can be interconnected, for example, by high temperature sintering, or by a reactive linking agent.

In certain embodiments, the linking agent can be a non-polymeric compound. The linking agent can exhibit similar electronic conductivity as the semiconductor particles. For example, for $TiO_2$ particles, the agent can include Ti—O bonds, such as those present in titanium alkoxides. Without wishing to be bound by theory, it is believed that titanium tetraalkoxide particles can react with each other, with $TiO_2$ particles, and with a conductive coating on a substrate, to form titanium oxide bridges that connect the particles with each other and with the conductive coating (not shown). As a result, the cross-linking agent enhances the stability and integrity of the semiconductor layer. The cross-linking agent can include, for example, an organometallic species such as a metal alkoxide, a metal acetate, or a metal halide. In some embodiments, the cross-linking agent can include a different metal than the metal in the semiconductor. In an exemplary cross-linking step, a cross-linking agent solution is prepared by mixing a sol-gel precursor agent, e.g., a titanium tetraalkoxide such as titanium tetrabutoxide, with a solvent, such as ethanol, propanol, butanol, or higher primary, secondary, or tertiary alcohols, in a weight ratio of 0-100%, e.g., about 5 to about 25%, or about 20%. Generally, the solvent can be any material that is stable with respect to the precursor agent, e.g., does not react with the agent to form metal oxides (e.g. $TiO_2$). The solvent preferably is substantially free of water, which can cause precipitation of $TiO_2$. Such linking agents are disclosed, for example, in published U.S. Patent Application 2003-0056821, which is hereby incorporated by reference.

In some embodiments, a linking agent can be a polymeric linking agent, such as poly(n-butyl titanate. Examples of polymeric linking agents are disclosed, for example, in co-pending and commonly owned U.S. Ser. No. 10/350,913, which is hereby incorporated by reference.

Linking agents can allow for the fabrication of an interconnected nanoparticle layer at relatively low temperatures (e.g., less than about 300° C.) and in some embodiments at room temperature. The relatively low temperature interconnection process may be amenable to continuous (e.g., roll-to-roll) manufacturing processes using polymer substrates.

The interconnected nanoparticles are generally photosensitized by the dye(s). The dyes facilitates conversion of incident light into electricity to produce the desired photovoltaic effect. It is believed that a dye absorbs incident light resulting in the excitation of electrons in the dye. The energy of the excited electrons is then transferred from the excitation levels of the dye into a conduction band of the interconnected nanoparticles. This electron transfer results in an effective separation of charge and the desired photovoltaic effect. Accordingly, the electrons in the conduction band of the interconnected nanoparticles are made available to drive an external load.

The dye(s) can be sorbed (e.g., chemisorbed and/or physisorbed) on the nanoparticles. A dye can be selected, for example, based on its ability to absorb photons in a wavelength range of operation (e.g., within the visible spectrum), its ability to produce free electrons (or electron holes) in a conduction band of the nanoparticles, its effectiveness in complexing with or sorbing to the nanoparticles, and/or its color.

In some embodiments, photoactive layer 4350 can further include one or more co-sensitizers that adsorb with a sensitizing dye to the surface of an interconnected semiconductor oxide nanoparticle material, which can increase the efficiency of a DSSC (e.g., by improving charge transfer efficiency and/or reducing back transfer of electrons from the interconnected semiconductor oxide nanoparticle material to the sensitizing dye). The sensitizing dye and the co-sensitizer may be added together or separately when forming the photosensitized interconnected nanoparticle material. The co-sensitizer can donate electrons to an acceptor to form stable cation radicals, which can enhance the efficiency of charge transfer from the sensitizing dye to the semiconductor oxide nanoparticle material and/or can reduce back electron transfer to the sensitizing dye or co-sensitizer. The co-sensitizer can include (1) conjugation of the free electron pair on a nitrogen atom with the hybridized orbitals of the aromatic rings to which the nitrogen atom is bonded and, subsequent to electron transfer, the resulting resonance stabilization of the cation radicals by these hybridized orbitals; and/or (2) a coordinating group, such as a carboxy or a phosphate, the function of which is to anchor the co-sensitizer to the semiconductor oxide. Examples of suitable co-sensitizers include aromatic amines (e.g., color such as triphenylamine and its derivatives), carbazoles, and other fused-ring analogues. Examples of photoactive layers including co-sensitizers are disclosed, for example, in co-pending and commonly owned U.S. Ser. No. 10/350,919, which is hereby incorporated by reference.

In some embodiments, photoactive layer 4350 can further include macroparticles of the semiconductor material, where at least some of the semiconductor macroparticles are chemically bonded to each other, and at least some of the semiconductor nanoparticles are bonded to semiconductor macroparticles. The dye(s) are sorbed (e.g., chemisorbed and/or physisorbed) on the semiconductor material. Macroparticles refers to a collection of particles having an average particle size of at least about 100 nanometers (e.g., at least about 150 nanometers, at least about 200 nanometers, at least about 250 nanometers). Examples of photovoltaic cells including macroparticles in the photoactive layer are disclosed, for example, in co-pending and commonly owned U.S. Ser. No. 60/589,423, which is hereby incorporated by reference.

In certain embodiments, a DSSC can include a coating that can enhance the adhesion of a photovoltaic material to a base material (e.g., using relatively low process temperatures, such as less than about 300° C.). Such photovoltaic cells and methods are disclosed, for example, in co-pending and commonly owned U.S. Ser. No. 10/351,260, which is hereby incorporated by reference.

The composition and thickness of electrically conductive layer 4320 is generally selected based on desired electrical conductivity, optical properties, and/or mechanical properties of the layer. In some embodiments, layer 4320 is transparent. Examples of transparent materials suitable for forming such a layer include certain metal oxides, such as indium tin oxide (ITO), tin oxide, and a fluorine-doped tin oxide. In some embodiments, electrically conductive layer 4320 can be formed of a foil (e.g., a titanium foil). Electrically conductive layer 4320 may be, for example, between about 100 nm and 500 nm thick, (e.g., between about 150 nm and 300 nm thick).

In certain embodiments, electrically conductive layer 4320 can be opaque (i.e., can transmit less than about 10% of the visible spectrum energy incident thereon). For example, layer 4320 can be formed from a continuous layer of an opaque metal, such as copper, aluminum, indium, or gold. In some embodiments, an electrically conductive layer can have an interconnected nanoparticle material formed thereon. Such layers can be, for example, in the form of strips (e.g., having a controlled size and relative spacing, between first and second flexible substrates). Examples of such DSSCs are disclosed, for example, in co-pending and commonly owned U.S. Ser. No. 10/351,251, which is hereby incorporated by reference.

In some embodiments, electrically conductive layer 4320 can include a discontinuous layer of an electrically conductive material. For example, electrically conductive layer 4320 can include an electrically conducting mesh. Suitable mesh materials include metals, such as palladium, titanium, platinum, stainless steels and alloys thereof. In some embodiments, the mesh material includes a metal wire. The electrically conductive mesh material can also include an electrically insulating material that has been coated with an electrically conducting material, such as a metal. The electrically insulating material can include a fiber, such as a textile fiber or monofilament. Examples of fibers include synthetic polymeric fibers (e.g., nylons) and natural fibers (e.g., flax, cotton, wool, and silk). The mesh electrically conductive layer can be flexible to facilitate, for example, formation of the DSSC by a continuous manufacturing process. Photovoltaic cells having mesh electrically conductive layers are disclosed, for example, in co-pending and commonly owned U.S. Ser. Nos. 10/395,823; 10/723,554 and 10/494,560, each of which is hereby incorporated by reference.

The mesh electrically conductive layer may take a wide variety of forms with respect to, for example, wire (or fiber) diameters and mesh densities (i.e., the number of wires (or fibers) per unit area of the mesh). The mesh can be, for example, regular or irregular, with any number of opening shapes. Mesh form factors (such as, e.g., wire diameter and mesh density) can be chosen, for example, based on the conductivity of the wire (or fibers) of the mesh, the desired optical transmissivity, flexibility, and/or mechanical strength. Typically, the mesh electrically conductive layer includes a wire (or fiber) mesh with an average wire (or fiber) diameter in the range from about one micron to about 400 microns, and an average open area between wires (or fibers) in the range from about 60% to about 95%.

Catalyst layer 4330 is generally formed of a material that can catalyze a redox reaction in the charge carrier layer positioned below. Examples of materials from which catalyst layer can be formed include platinum and polymers, such as polythiophenes, polypyrroles, polyanilines and their derivatives. Examples of polythiophene derivatives include poly(3,4-ethylenedioxythiophene) ("PEDOT"), poly(3-butylthiophene), poly[3-(4-octylphenyl)thiophene], poly(thieno[3,4-b]thiophene) ("PT34bT"), and poly(thieno[3,4-b]thiophene-co-3,4-ethylenedioxythiophene) ("PT34bT-PEDOT"). Examples of catalyst layers containing one or more polymers are disclosed, for example, in co-pending and commonly owned U.S. Ser. Nos. 10/897,268 and 60/637,844, both of which are hereby incorporated by reference.

Substrate 4310 can be formed from a mechanically-flexible material, such as a flexible polymer, or a rigid material, such as a glass. Examples of polymers that can be used to form a flexible substrate include polyethylene naphthalates (PEN), polyethylene terephthalates (PET), polyethyelenes, polypropylenes, polyamides, polymethylmethacrylate, polycarbonate, and/or polyurethanes. Flexible substrates can facilitate continuous manufacturing processes such as web-based coating and lamination. However, rigid substrate materials may also be used, such as disclosed, for example, in co-pending and commonly owned U.S. Ser. No. 10/351,265, which is hereby incorporated by reference.

The thickness of substrate 4310 can vary as desired. Typically, substrate thickness and type are selected to provide mechanical support sufficient for the DSSC to withstand the rigors of manufacturing, deployment, and use. Substrate 4310 can have a thickness of from about six microns to about 5,000 microns (e.g., from about 6 microns to about 50 microns, from about 50 microns to about 5,000 microns, from about 100 microns to about 1,000 microns).

In embodiments where electrically conductive layer 4320 is transparent, substrate 310 is formed from a transparent material. For example, substrate 4310 can be formed from a transparent glass or polymer, such as a silica-based glass or a polymer, such as those listed above. In such embodiments, electrically conductive layer 4320 may also be transparent.

Substrate 4370 and electrically conductive layer 4360 can be as described above regarding substrate 4310 and electrically conductive layer 4320, respectively. For example, substrate 4370 can be formed from the same materials and can have the same thickness as substrate 4310. In some embodiments however, it may be desirable for substrate 4370 to be different from 4310 in one or more aspects. For example, where the DSSC is manufactured using a process that places different stresses on the different substrates, it may be desirable for substrate 4370 to be more or less mechanically robust than substrate 4310. Accordingly, substrate 4370 may be formed from a different material, or may have a different thickness that substrate 4310. Furthermore, in embodiments where only one substrate is exposed to an illumination source during use, it is not necessary for both substrates and/or electrically conducting layers to be transparent. Accordingly, one of substrates and/or corresponding electrically conducting layer can be opaque.

Generally, charge carrier layer 4340 includes a material that facilitates the transfer of electrical charge from a ground potential or a current source to photoactive layer 4350. A general class of suitable charge carrier materials include solvent-based liquid electrolytes, polyelectrolytes, polymeric electrolytes, solid electrolytes, n-type and p-type transporting materials (e.g., conducting polymers) and gel electrolytes. Examples of gel electrolytes are disclosed, for example, in co-pending and commonly owned U.S. Ser. No. 10/350,912, which is hereby incorporated by reference. Other choices for charge carrier media are possible. For example, the charge carrier layer can include a lithium salt that has the formula LiX, where X is an iodide, bromide, chloride, perchlorate, thiocyanate, trifluoromethyl sulfonate, or hexafluorophosphate.

The charge carrier media typically includes a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to one, where X is an anion, and M is lithium, copper, barium, zinc, nickel, a lanthanide, cobalt, calcium, aluminum, or magnesium. Suitable anions include chloride, perchlorate, thiocyanate, trifluoromethyl sulfonate, and hexafluorophosphate.

In some embodiments, the charge carrier media includes a polymeric electrolyte. For example, the polymeric electrolyte can include poly(vinyl imidazolium halide) and lithium iodide and/or polyvinyl pyridinium salts. In embodiments, the charge carrier media can include a solid electrolyte, such as lithium iodide, pyridimum iodide, and/or substituted imidazolium iodide.

The charge carrier media can include various types of polymeric polyelectrolytes. For example, suitable polyelectrolytes can include between about 5% and about 95% (e.g., 5-60%, 5-40%, or 5-20%) by weight of a polymer, e.g., an ion-conducting polymer, and about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide (PEO), polyacrylonitrile (PAN), polymethylmethacrylate (PMMA), polyethers, and polyphenols. Examples of suitable plasticizers include ethyl carbonate, propylene carbonate, mixtures of carbonates, organic phosphates, butyrolactone, and dialkylphthalates.

In some embodiments, charge carrier layer 4340 can include one or more zwitterionic compounds. Charge carrier layers including one or more zwitterionic compounds are disclosed, for example, in co-pending and commonly owned U.S. Ser. No. 11/000,276, which is hereby incorporated by reference.

Figure 17:
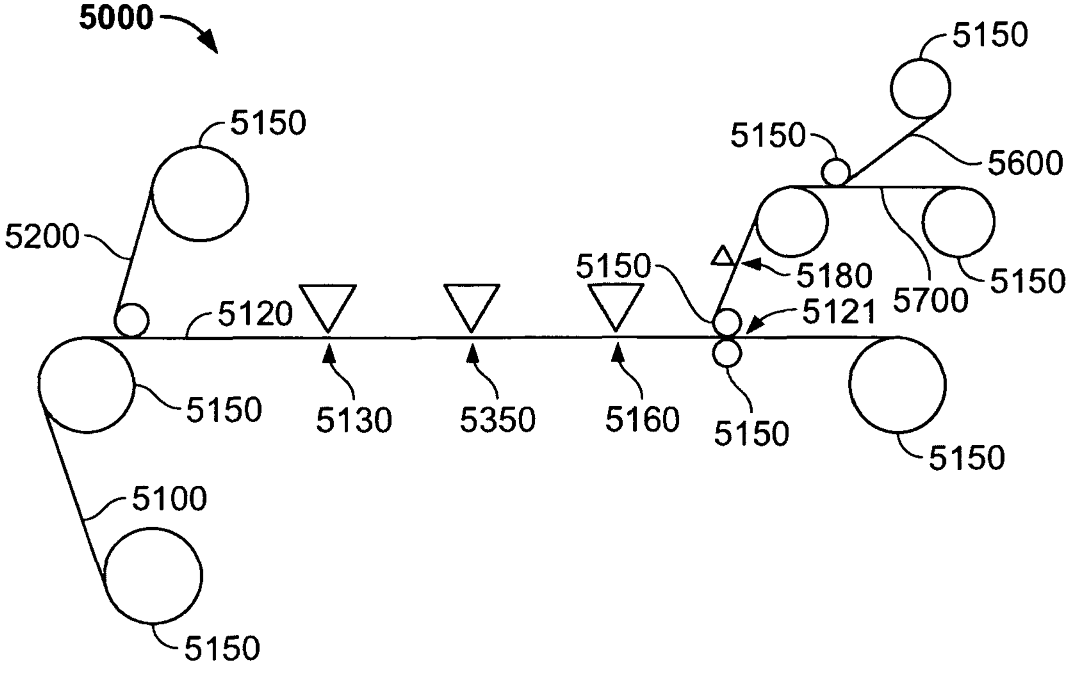
FIG. 17 is a schematic representation of an embodiment of a method of making a DSSC.

FIG. 17 shows a process (a roll-to-roll process) 5000 for manufacturing a DSSC by advancing a substrate 5100 between rollers 5150. Substrate 5100 can be advanced between rollers 5150 continuously, periodically, or irregularly during a manufacturing run.

An electrically conductive layer 5200 (e.g., a titanium foil) is attached to substrate 5100 adjacent location 5120.

An interconnected nanoparticle material is then formed on the electrically conductive layer adjacent location 5130. The interconnected nanoparticle material can be formed by applying a solution containing a linking agent (e.g., polymeric linking agent, such as poly(n-butyl titanate)) and metal oxide nanoparticles (e.g., titania). In some embodiments, the polymeric linking agent and the metal oxide nanoparticles are separately applied to form the interconnected nanoparticle material. The polymeric linking agent and metal oxide nanoparticles can be heated (e.g., in an oven present in the system used in the roll-to-roll process) to form the interconnected nanoparticle material.

One or more dyes are then applied (e.g., using silk screening, ink jet printing, or gravure printing) to the interconnected nanoparticle material adjacent location 5350 to form a photoactive layer.

A charge carrier layer is deposited onto the patterned photoactive layer adjacent location 5160. The charge carrier layer can be deposited using known techniques, such as those noted above.

An electrically conductive layer 5600 (e.g., ITO) is attached to substrate 5700 adjacent location 5190.

A catalyst layer precursor is deposited on electrically conductive layer 5600 adjacent location 5180. The catalyst layer precursor can be deposited on electrically conductive layer 5600 using, for example, electrochemical deposition using chloroplatinic acid in an electrochemical cell, or pyrolysis of a coating containing a platinum compound (e.g., chloroplatinic acid). In general, the catalyst layer precursor can be deposited using known coating techniques, such as spin coating, dip coating, knife coating, bar coating, spray coating, roller coating, slot coating, gravure coating, screen coating, and/or ink jet printing. The catalyst layer precursor is then heated (e.g., in an oven present in the system used in the roll-to-roll process) to form the catalyst layer. In some embodiments, electrically conductive material 5600 can be at least partially coated with the catalyst layer before attaching to advancing substrate 5700. In certain embodiments, the catalyst layer is applied directly to electrically conductive layer 5600 (e.g., without the presence of a precursor).

In some embodiments, the method can include scoring the coating of a first coated base material at a temperature sufficiently elevated to part the coating and melt at least a portion of the first base material, and/or scoring a coating of a second coated base material at a temperature sufficiently elevated to part the coating and at least a portion of the second base material, and optionally joining the first and second base materials to form a photovoltaic module. DSSCs with metal foil and methods for the manufacture are disclosed, for example, in co-pending and commonly owned U.S. Ser. No. 10/351,264, which is hereby incorporated by reference.

In certain embodiments, the method can include slitting (e.g., ultrasonic slitting) to cut and/or seal edges of photovoltaic cells and/or modules (e.g., to encapsulate the photoactive components in an environment substantially impervious to the atmosphere). Examples of such methods are disclosed, for example, in co-pending and commonly owned U.S. Ser. No. 10/351,250, which is hereby incorporated by reference.

Polymer Photovoltaic Cells

Figure 18:
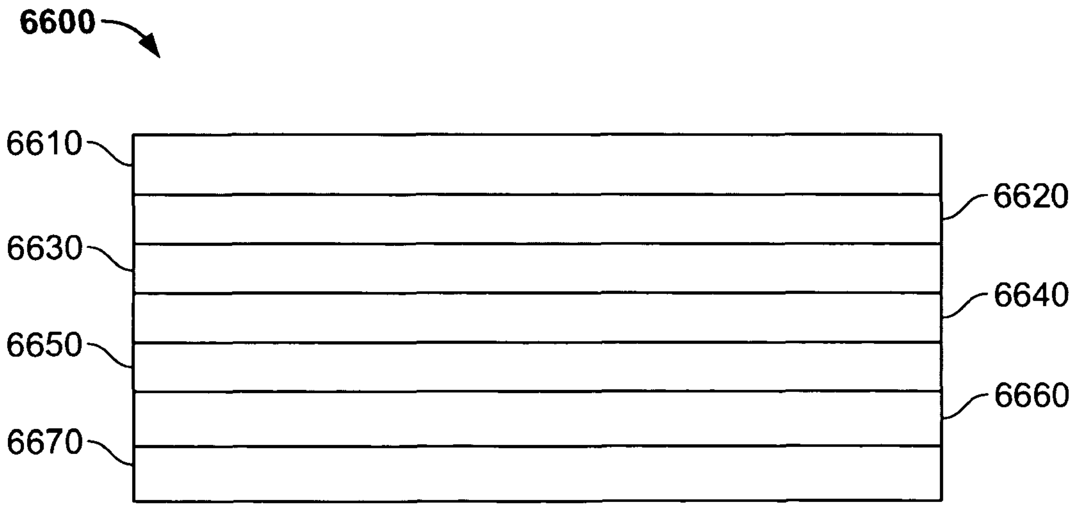
FIG. 18 is a cross-sectional view of a polymer photovoltaic cell.

In certain embodiments, a photovoltaic cell is a polymer photovoltaic cell. FIG. 18 shows a polymer photovoltaic cell 6600 that includes substrates 6610 and 6670, electrically conductive layers 6620 and 6660, a hole blocking layer 6630, a photoactive layer 6640, and a hole carrier layer 6650.

In general, substrate 6610 and/or substrate 6670 can be as described above with respect to the substrates in a DSSC. Exemplary materials include polyethylene tereplithalate (PET), polyethylene naphthalate (PEN), or a polyimide. An example of a polyimide is a KAPTON® polyimide film (available from E. I. du Pont de Nemours and Co.).

Generally, electrically conductive layer 6620 and/or electrically conductive layer 670 can be as described with respect to the electrically conductive layers in a DSSC.

Hole blocking layer 6630 is generally formed of a material that, at the thickness used in photovoltaic cell 6600, transports electrons to electrically conductive layer 6620 and substantially blocks the transport of holes to electrically conductive layer 6620. Examples of materials from which layer 6630 can be formed include LiF, metal oxides (e.g., zinc oxide, titanium oxide) and combinations thereof. While the thickness of layer 630 can generally be varied as desired, this thickness is typically at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick. In some embodiments, this distance is from 0.01 micron to about 0.5 micron. In some embodiments, layer 6630 is a thin LiF layer. Such layers are disclosed, for example, in co-pending and commonly owned U.S. Ser. No. 10/258,708, which is hereby incorporated by reference.

Hole carrier layer 6650 is generally formed of a material that, at the thickness used in photovoltaic cell 6600, transports holes to electrically conductive layer 6660 and substantially blocks the transport of electrons to electrically conductive layer 6660. Examples of materials from which layer 6650 can be formed include polythiophenes (e.g., PEDOT), polyanilines, polyvinylcarbazoles, polyphenylenes, polyphenylvinylenes, polysilanes, polythienylenevinylenes, polyisothianaphthanenes and combinations thereof. While the thickness of layer 6650 can generally be varied as desired, this thickness is typically at least 0.01 micron (e.g., at least about 0.05 micron, at least about 0.1 micron, at least about 0.2 micron, at least about 0.3 micron, at least about 0.5 micron) and/or at most about five microns (e.g., at most about three microns, at most about two microns, at most about one micron). In some embodiments, this distance is from 0.01 micron to about 0.5 micron.

Photoactive layer 6640 generally includes an electron acceptor material and an electron donor material.

Examples of electron acceptor materials include formed of fullerenes, oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups). In some embodiments, the electron acceptor material is a substituted fullerene (e.g., PCBM). In some embodiments, the fullerenes can be derivatized. For example, a fullerene derivative can includes a fullerene (e.g., PCBG), a pendant group (e.g., a cyclic ether such as epoxy, oxetane, or furan) and a linking group that spaces the pendant group apart from the fullerene. The pendant group is generally sufficiently reactive that fullerene derivative may be reacted with another compound (e.g., another fullerene derivative) to prepare a reaction product. Photoactive layers including derivatized fullerenes are disclosed, for example, in co-pending and commonly owned U.S. Ser. No. 60/576,033, which is hereby incorporated by reference. Combinations of electron acceptor materials can be used.

Examples of electron donor materials include discotic liquid crystals, polythiophenes, polyphenylenes, polyphenylvinylenes, polysilanes, polythienylvinylenes, and polyisothianaphthalenes. In some embodiments, the electron donor material is poly(3-hexylthiophene). In certain embodiments, photoactive layer 6640 can include a combination of electron donor materials.

In some embodiments, photoactive layer 6640 includes an oriented electron donor material (e.g., a liquid crystal (LC) material), an electroactive polymeric binder carrier (e.g., a poly(3-hexylthiophene) (P3HT) material), and a plurality of nanocrystals (e.g., oriented nanorods including at least one of ZnO, $WO_3$, or $TiO_2$). The liquid crystal (LC) material can be, for example, a discotic nematic LC material, including a plurality of discotic mesogen units. Each unit can include a central group and a plurality of electroactive arms. The central group can include at least one aromatic ring (e.g., an anthracene group). Each electroactive arm can include a plurality of thiophene moieties and a plurality of alkyl moieties. Within the photoactive layer, the units can align in layers and columns. Electroactive arms of units in adjacent columns can interdigitate with one another facilitating electron transfer between units. Also, the electroactive polymeric carrier can be distributed amongst the LC material to further facilitate electron transfer. The surface of each nanocrystal can include a plurality of electroactive surfactant groups to facilitate electron transfer from the LC material and polymeric carrier to the nanocrystals. Each surfactant group can include a plurality of thiophene groups. Each surfactant can be bound to the nanocrystal via, for example, a phosphonic end-group. Each surfactant group also can include a plurality of alkyl moieties to enhance solubility of the nanocrystals in the photoactive layer. Examples of photovoltaic cells are disclosed, for example, in co-pending and commonly owned U.S. Ser. No. 60/664,336, which is hereby incorporated by reference.

In certain embodiments, the electron donor and electron acceptor materials in layer 6640 can be selected so that the electron donor material, the electron acceptor material and their mixed phases have an average largest grain size of less than 500 nanometers in at least some sections of layer 6640. In such embodiments, preparation of layer 6640 can include using a dispersion agent (e.g., chlorobenzene) as a solvent for both the electron donor and the electron acceptor. Such photoactive layers are disclosed, for example, in co-pending and commonly owned U.S. Ser. No. 10/258,713, which is hereby incorporated by reference.

Generally, photoactive layer 6640 is sufficiently thick to be relatively efficient at absorbing photons impinging thereon to form corresponding electrons and holes, and sufficiently thin to be relatively efficient at transporting the holes and electrons to the electrically conductive layers of the device. In certain embodiments, layer 6640 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, layer 6640 is from 0.1 micron to about 0.2 micron thick.

In some embodiments, the transparency of photoactive layer 6640 can change as an electric field to which layer 6640 is exposed changes. Such photovoltaic cells are disclosed, for example, in co-pending and commonly owned U.S. Ser. No. 10/486,116, which is hereby incorporated by reference.

In some embodiments, cell 6600 can further include an additional layer (e.g., formed of a conjugated polymer, such as a doped poly(3-alkylthiophene)) between photoactive layer 6640 and electrically conductive layer 6620, and/or an additional layer (e.g., formed of a conjugated polymer) between photoactive layer 6640 and electrically conductive layer 6660. The additional layer(s) can have a band gap (e.g., achieved by appropriate doping) of 1.8 eV. Such photovoltaic cells are disclosed, for example, in U.S. Pat. No. 6,812,399, which is hereby incorporated by reference.

Optionally, cell 6600 can further include a thin LiF layer between photoactive layer 6640 and electrically conductive layer 6660. Such layers are disclosed, for example, in co-pending and commonly owned U.S. Ser. No. 10/258,708, which is hereby incorporated by reference.

In some embodiments, cell 6600 can be prepared as follows. Electrically conductive layer 6620 is formed upon substrate 6610 using conventional techniques. Electrically conductive layer 6620 is configured to allow an electrical connection to be made with an external load. Layer 6630 is formed upon electrically conductive layer 6620 using, for example, a solution coating process, such as slot coating, spin coating or gravure coating. Photoactive layer 6640 is formed upon layer 6630 using, for example, a solution coating process. Layer 6650 is formed on photoactive layer 6640 using, for example, a solution coating process, such as slot coating, spin coating or gravure coating. Electrically conductive layer 6620 is formed upon layer 6650 using, for example, a vacuum coating process, such as evaporation or sputtering.

In certain embodiments, preparation of cell 6600 can include a heat treatment above the glass transition temperature of the electron donor material for a predetermined treatment time. To increase efficiency, the heat treatment of the photovoltaic cell can be carried out for at least a portion of the treatment time under the influence of an electric field induced by a field voltage applied to the electrically conductive layers of the photovoltaic cell and exceeding the no-load voltage thereof. Such methods are disclosed, for example, in co-pending and commonly owned U.S. Ser. No. 10/509,935, which is hereby incorporated by reference.

Other Embodiments

While certain embodiments have been disclosed, others are also possible.

As an example, although embodiments have been described in which an electrically conductive interconnect is a stitch, in certain embodiments an electrically conductive interconnect can be in the form of a staple or a grommet. Examples of suitable material used to form the staples and/or grommets include those noted above with respect to a staple conductive interconnect.

As another example, although embodiments have been described in which the overlapping region between adjacent photovoltaic cells is secured with one electrically conductive interconnect, in certain embodiments, in some embodiments more than one (e.g., two or more, three or more, four or more, five or more, six or more, seven or more) electrically conductive interconnects can be used to secure the overlapping region.

As a further example, while embodiments have been described in which the cathode has a shaped or bent portion that forms an electrical connection with the anode, in some embodiments, the anode has a bent or shaped portion that forms an electrical connection with the cathode. In certain embodiments, both the cathodes and anodes have such bent or shaped portions.

As an additional example, in some embodiments, an electrically conductive material, such as an electrically conductive adhesive, can be disposed between the shaped or bent portion of the cathode and the anode.

As a further example, while photovoltaic modules have been described as including three photovoltaic cells, a photovoltaic module can include more than three (e.g., four, five, six, seven) photovoltaic cells.

As another example, the adhesive can generally be formed of any electrically insulative adhesive. Examples of such adhesives include co-polymers of olefins, acrylates, and urethanes, and other hotmelt adhesives. Examples of commercially available adhesives include Bynel® adhesives (available from DuPont), thermobond adhesive 845 (available from 3M) and Dyneon® THV220 fluoropolymer adhesive (available from 3M).

As an additional example, although the materials in the charge carrier layers have been described above as being distinct from the materials forming the photoactive layer, in some embodiments, one or more materials within the charge carrier layer can be at least partially disposed within (e.g., intermixed with) the photoactive layer. In certain embodiments, the materials within the charge carrier layer and the photoactive layer can be combined to form a composite layer.

As a further example, a protective layer can be applied to the upper and/or lower substrates. A protective layer can be used to, for example, keep contaminants (e.g., dirt, water, oxygen, chemicals) out of a photovoltaic cell and/or to mechanically strengthen the cell. A protective layer can be formed of a polymer (e.g., a fluorinated polymer).

As an additional example, although the materials in the charge carrier layers have been described above as being distinct from the materials forming the photoactive layer, in some embodiments, one or more materials within the charge carrier layer can be at least partially disposed within (e.g., intermixed with) the photoactive layer. In certain embodiments, the materials within the charge carrier layer and the photoactive layer can be combined to form a composite layer.

As a further example, a protective layer can be applied to the upper and/or lower substrates. A protective layer can be used to, for example, keep contaminants (e.g., dirt, water, oxygen, chemicals) out of a photovoltaic cell and/or to mechanically strengthen the cell. A protective layer can be formed of a polymer (e.g., a fluorinated polymer).

An another example, while embodiments have been described in which one or more electrically conductive interconnects are used, in some embodiments, one or more interconnects that are not electrically conductive can be used. In certain embodiments, only interconnects (e.g., one or more interconnects, two or more interconnects, three or more interconnects, four or more interconnects, five or more interconnects, six or more interconnects) that are not electrically conductive are used. In some embodiments, one or more electrically conductive interconnects and one or more interconnects that are not electrically conductive are used.

Further, while certain types of photovoltaic modules with interconnects have been described, interconnects can also be used in other types of modules. Examples include photovoltaic modules that include photovoltaic cells with active material formed of amorphous silicon, cadmium selenide, cadmium telluride, copper indium sulfide, and/or copper indium gallium arsenide.

Figure 19:
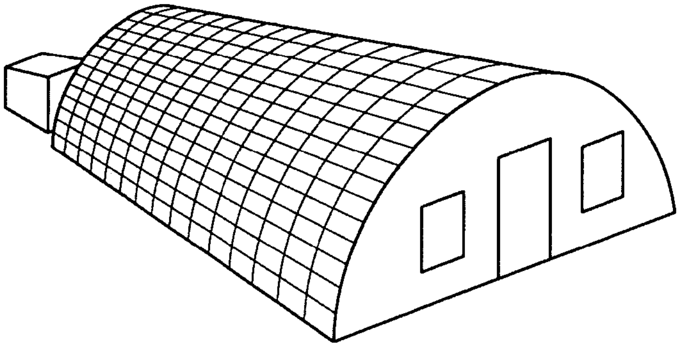
FIG. 19 shows a structure including a photovoltaic module.
Figure 20:
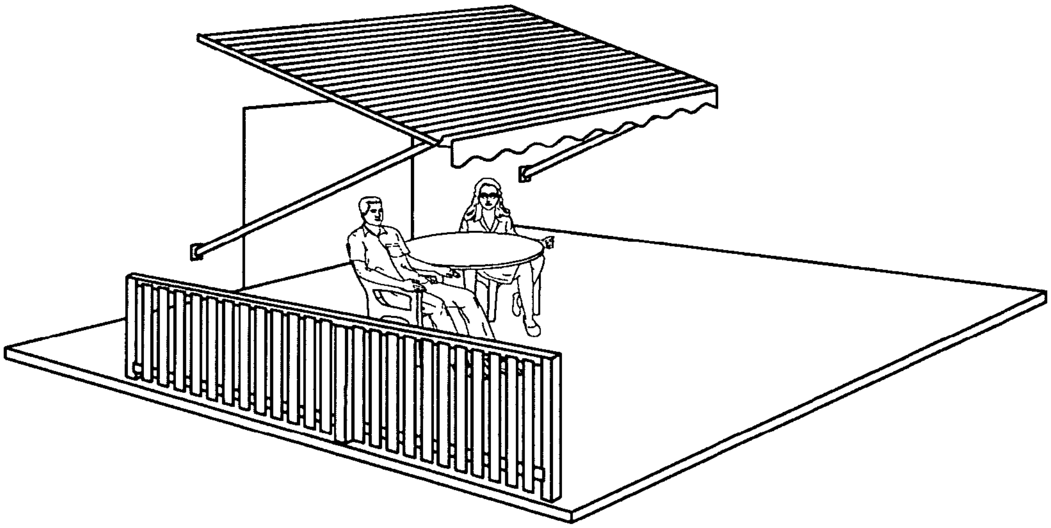
FIG. 20 shows a structure including a photovoltaic module.
Figure 21:
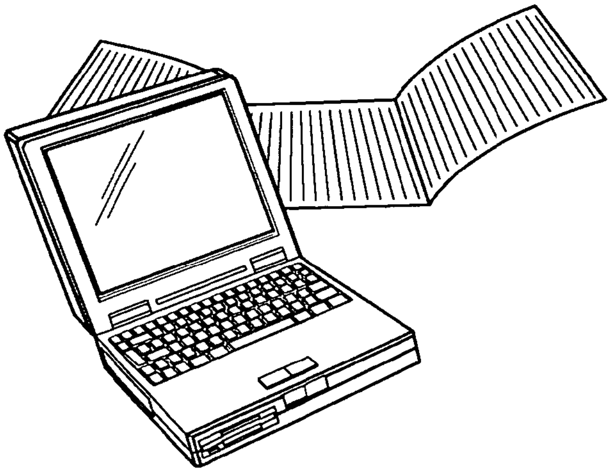
FIG. 21 shows a structure including a photovoltaic module.

A photovoltaic module can generally be used as a component in any desired application. FIG. 19 shows a photovoltaic module incorporated into exterior wall panels or exterior cladding fitted to a corrugated structure. FIG. 20 shows a photovoltaic module incorporated into an awning. FIG. 21 shows a photovoltaic module incorporated into a battery charger a portable electronic device. Other applications include, for example, package labeling, sensors, window shades, window blinds, and/or windows (e.g., opaque windows, semitransparent windows).

The following example is illustrative and not intended to be limiting.

EXAMPLE 1

A photovoltaic cell was prepared as follows.

A 50 micron thick titanium foil was cut to have a size of 0.7 cm by 7 cm to form the cathode of the photovoltaic cell. A 15 micron thick porous layer of $TiO_2$ was deposited on one of the surfaces of the cathode using slot coating to form a portion of the photoactive layer. The $TiO_2$ layer was coated with 30-50 mgs/$m^2$ of a photosensitizing agent to complete the photoactive layer.

The photoactive layer was then imbibed with 0.3-1.0 g/$m^2$ of an electrolyte that contains the redox couple $I^-/I_3^-$ to form the charge carrier layer within the photovoltaic cell.

The anode of the photovoltaic cell was prepared by sputtering a 300 nm thick layer of ITO onto a surface of a PEN substrate that was 8 cm long, 2 cm wide, and 200 microns thick. A less than one nm thick layer of platinum was then sputtered on top of the ITO layer to form the catalyst layer. The photovoltaic cell was completed by joining the catalyst layer to the photoactive layer imbibed with electrolyte using THV adhesive (available from Dyneon).

Another photovoltaic cell was prepared using the same process.

Figure 22:
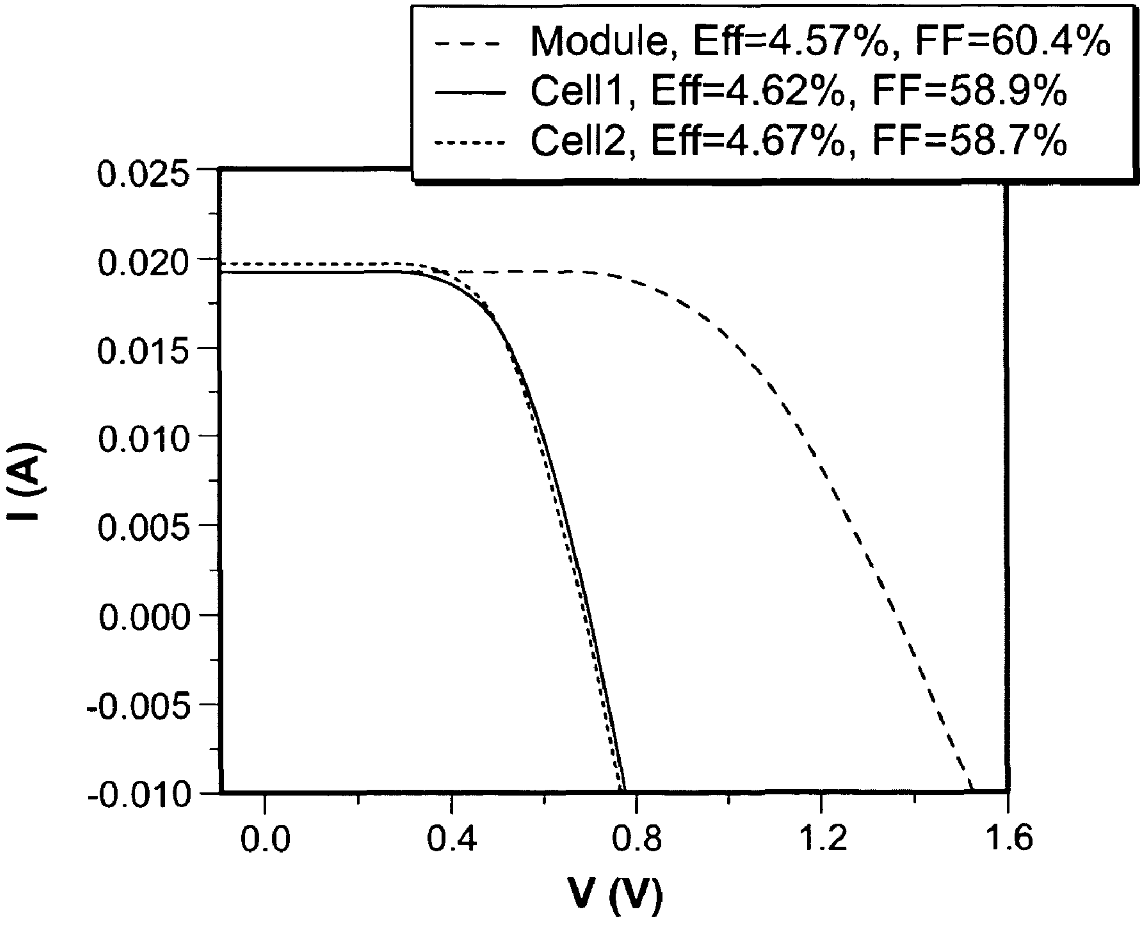
FIG. 22 graphically depict the efficiencies for two individual cells and a module formed by the composite of the two cells.

Each of the two photovoltaic cells was exposed to an A.M. 1.5 (100 mW per square cm) light source (Oriel Solar Simulator) for 30 seconds. The current generated within each of the two photovoltaic cells was measured and plotted against voltage, the results of which are shown in FIG. 22. The efficiency of the first cell was 4.57%, and the efficiency of the second cell was 4.62%.

The fill factor of the first cell was 60.4%, and the fill factor of the second cell was 58.9%.

The two photovoltaic cells were then combined to create a photovoltaic module having the design shown in FIG. 4 (2 mm wide overlapping region). Steel staples (spaced approximately 5 mm from each other) were driven through the overlapping region to electrically connect and secure the two photovoltaic cells together to form a module.

The module was exposed to the same light source noted above and under the same conditions for 30 seconds. The current generated within the module was measured and plotted against voltage. The current versus voltage results are shown in FIG. 22.

The efficiency of the module was 4.67% was determined as described above. The fill factor of the module was 58.7%.

Thus, the fill factor of the module was only slightly higher than the fill factor of either cell, and the efficiency of the module was only slightly lower than the individual efficiency of either cell.

Other embodiments are in the claims.

What is claimed is:

1. A module, comprising:
- a first photovoltaic cell including an electrode;
- a second photovoltaic cell including an electrode;
- an interconnect that connects the electrodes of first and second photovoltaic cells;
- a first substrate;
- a second substrate; and
- a first adhesive material, the first adhesive material being electrically insulative, wherein:
  - a portion of the electrode of the first photovoltaic cell overlaps a portion of the electrode of the second photovoltaic cell;
  - the first photovoltaic cell is between the first and second substrates;
  - the second photovoltaic cell is between the first and second substrates;
  - a first portion of the first adhesive material is between the electrode of the first photovoltaic cell and the second substrate;
  - a second portion of the first adhesive material is between the electrode of the second photovoltaic cell and the first substrate;
  - the interconnect is between the first and second portions of the first adhesive material; and
  - the interconnect comprises:
    - a second adhesive material, the second adhesive material being electrically insulative; and
    - a first mesh partially disposed in the second adhesive material, the first mesh comprising an electrically conductive material.

2. The module of claim 1, wherein the first mesh is an expanded mesh.

3. The module of claim 1, wherein the electrode of the first photovoltaic cell is a cathode and the electrode of the second photovoltaic cell is an anode.

4. The module of claim 1, wherein the electrode of the first photovoltaic cell is a cathode and the electrode of the second photovoltaic cell is a cathode.

5. The module of claim 1, wherein the electrode of the first photovoltaic cell is an anode and the electrode of the second photovoltaic cell is an anode.

6. The module of claim 1, wherein the first and second photovoltaic cells share at least one common substrate.

7. The module of claim 1, further comprising:
- a third photovoltaic cell including an electrode; and
- a second interconnect that connects the electrodes of the second and third photovoltaic cells,
- wherein the second interconnect comprises:
  - a third adhesive material; and
  - a second mesh partially disposed in the adhesive third material.

8. The module of claim 1, wherein the module has first and second ends, and the first and second ends are sealed.

9. A module, comprising:
- a first substrate;
- a second substrate;
- a first photovoltaic cell including:
  - a cathode;
  - an anode, the cathode of the first photovoltaic cell and the anode of the first photovoltaic cell being between the first and second substrates; and
  - a photoactive material between the cathode and the anode of the first photovoltaic cell;
- a second photovoltaic cell including:
  - a cathode;
  - an anode, the cathode of the second photovoltaic cell and the anode of the second photovoltaic cell being between the first and second substrates; and
  - a photoactive material between the cathode and the anode of the second photovoltaic cell;

a first adhesive material, the first adhesive material being electrically insulative, the first adhesive material including a first portion and a second portion, wherein the first portion of the first adhesive material is in direct contact with the cathode of the first photovoltaic cell and the second substrate, and the second portion of the first adhesive material is in direct contact with the anode of the second photovoltaic cell and the first substrate; and an interconnect that connects the cathode of first photovoltaic cell and the anode of the second photovoltaic cell, wherein the interconnect comprises:

a second adhesive material, the second adhesive material being electrically insulative; and a mesh partially disposed in the second adhesive material, the mesh being in direct contact with the cathode of the first photovoltaic cell and the anode of the second photovoltaic cell; and wherein the interconnect is between first and second portions of the first adhesive material.

10. The module of claim 9, wherein the first mesh comprises an electrically conductive material.

11. The module of claim 9, wherein the first mesh is an expanded mesh.

12. A module, comprising:

a first substrate;

a second substrate;

a first photovoltaic cell including:

a cathode;

an anode, the cathode of the first photovoltaic cell and the anode of the first photovoltaic cell being between the first and second substrates; and a photoactive material between the cathode of the first photovoltaic cell and the anode of the first photovoltaic cell;

a second photovoltaic cell including:

a cathode;

an anode, the cathode of the second photovoltaic cell and the anode of the second photovoltaic cell being between the first and second substrates; and a photoactive material between the cathode of the second photovoltaic cell and the anode of the second photovoltaic cell;

a first adhesive material, the first adhesive material being electrically insulative, the first adhesive material including a first portion and a second portion, wherein the first portion of the first adhesive material is in direct contact with the cathode of the first photovoltaic cell and the second substrate, and the second portion of the first adhesive material is in direct contact with the cathode of the second photovoltaic cell and the first substrate; and an interconnect that connects the cathode of first photovoltaic cell and the cathode of the second photovoltaic cell, wherein the interconnect comprises:

a second adhesive material, the second adhesive material being electrically insulative; and a mesh partially disposed in the second adhesive material, the mesh being in direct contact with the cathode of the first photovoltaic cell and the cathode of the second photovoltaic cell; and wherein the interconnect is between first and second portions of the first adhesive material.

13. The module of claim 12, wherein the mesh comprises an electrically conductive material.

14. The module of claim 12, wherein the mesh is an expanded mesh.

15. The module of claim 1, wherein the electrode of the first photovoltaic cell is electrically connected to the electrode of the second photovoltaic cell.

16. The module of claim 1, wherein the electrode of the first photovoltaic cell is mechanically connected to the electrode of the second photovoltaic cell.

17. The module of claim 9, wherein the interconnect electrically connects the cathode of first photovoltaic cell and the anode of the second photovoltaic cell.

18. The module of claim 9, wherein the interconnect mechanically connects the cathode of first photovoltaic cell and the anode of the second photovoltaic cell.

19. The module of claim 12, wherein the interconnect electrically connects the cathode of first photovoltaic cell and the cathode of the second photovoltaic cell.

20. The module of claim 12, wherein the interconnect mechanically connects the cathode of first photovoltaic cell and the cathode of the second photovoltaic cell.

21. The module of claim 1, wherein the second adhesive material comprises a polymer.

22. The module of claim 9, wherein the second adhesive material comprises a polymer.

23. The module of claim 12, wherein the second adhesive material comprises a polymer.

24. A module, comprising:

a first photovoltaic cell including:

a cathode;

an anode; and a photoactive material between the cathode and the anode;

a second photovoltaic cell including:

a cathode;

an anode; and a photoactive material between the cathode and the anode;

a first adhesive material, the first adhesive material being electrically insulating, the first adhesive material including a first portion and a second portion, wherein the first portion of the first adhesive material is in direct contact with the first electrode and the second substrate, and the second portion of the first adhesive material is in direct contact with the second electrode and the first substrate; and an interconnect that connects a first electrode and a second electrode, the first electrode being the cathode of first photovoltaic cell or the anode of the first photovoltaic cell, and the second electrode being the cathode of the second photovoltaic cell or the anode of the second photovoltaic cell, wherein the interconnect comprises:

a second adhesive material, the second adhesive material being electrically insulative; and an expanded mesh partially disposed in the second adhesive material, the mesh being in direct contact with the first and second electrodes; and wherein the interconnect is between first and second portions of the first adhesive material.

25. The module of claim 9, wherein a portion of the electrode of the first photovoltaic cell overlaps a portion of the electrode of the second photovoltaic cell.

26. The module of claim 12, wherein a portion of the electrode of the first photovoltaic cell overlaps a portion of the electrode of the second photovoltaic cell.

27. The module of claim 1, wherein the first portion of the first adhesive material is in direct contact with the electrode of the first photovoltaic cell, the first portion of the first adhesive material is in direct contact with the second substrate, the second portion of the first adhesive material is in direct contact with the electrode of the second photovoltaic cell, and the second portion of the first adhesive material is in direct contact with the first substrate.

28. The module of claim 1, wherein the interconnect has a first side and a second side opposite the first side, the first side of the interconnect is in direct contact with the first portion of the first adhesive material, the first side of the interconnect is completely covered by the first portion of the first adhesive material, the second side of the interconnect is in direct contact with the second portion of the first adhesive material, and the second side of the interconnect is completely covered by the second portion of the first adhesive material.

29. The module of claim 1, wherein the first substrate is parallel to the second substrate, the electrode of the first photovoltaic cell is parallel to the electrode of the second photovoltaic cell, and the electrode of the first photovoltaic cell is parallel to the second substrate.

30. The module of claim 9, wherein the interconnect has a first side and a second side opposite the first side, the first side of the interconnect is in direct contact with the first portion of the first adhesive material, the first side of the interconnect is completely covered by the first portion of the first adhesive material, the second side of the interconnect is in direct contact with the second portion of the first adhesive material, and the second side of the interconnect is completely covered by the second portion of the first adhesive material.

31. The module of claim 9, wherein the first substrate is parallel to the second substrate, the cathode of the first photovoltaic cell is parallel to the anode of the second photovoltaic cell, and the cathode of the first photovoltaic cell is parallel to the second substrate.

32. The module of claim 12, wherein the interconnect has a first side and a second side opposite the first side, the first side of the interconnect is in direct contact with the first portion of the first adhesive material, the first side of the interconnect is completely covered by the first portion of the first adhesive material, the second side of the interconnect is in direct contact with the second portion of the first adhesive material, and the second side of the interconnect is completely covered by the second portion of the first adhesive material.

33. The module of claim 12, wherein the first substrate is parallel to the second substrate, the cathode of the first photovoltaic cell is parallel to the cathode of the second photovoltaic cell, and the cathode of the first photovoltaic cell is parallel to the second substrate.

34. The module of claim 24, wherein the interconnect has a first side and a second side opposite the first side, the first side of the interconnect is in direct contact with the first portion of the first adhesive material, the first side of the interconnect is completely covered by the first portion of the first adhesive material, the second side of the interconnect is in direct contact with the second portion of the first adhesive material, and the second side of the interconnect is completely covered by the second portion of the first adhesive material.

35. The module of claim 24, further comprising first and second substrates, wherein the first photovoltaic cell is between the first and second substrates, the second photovoltaic cell is between the first and second substrates, the first substrate is parallel to the second substrate, the first electrode is parallel to the second electrode, and the first electrode is parallel to the second substrate.

* * * * *